(12) United States Patent
Tanaka

(10) Patent No.: US 10,408,856 B2
(45) Date of Patent: Sep. 10, 2019

(54) ELECTRONIC DEVICE, METHOD OF MANUFACTURING ELECTRONIC DEVICE, PHYSICAL QUANTITY SENSOR, ELECTRONIC APPARATUS AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

(*) Notice: Subject to any disclaimer, the term of this patent is extended or adjusted under 35 U.S.C. 154(b) by 1 day.

(21) Appl. No.: 14/987,186

(22) Filed: Jan. 4, 2016

(65) Prior Publication Data

US 2016/0195567 A1    Jul. 7, 2016

(30) Foreign Application Priority Data

Jan. 6, 2015 (JP) ................. 2015-000681

(51) Int. Cl.
```
B81B 3/00      (2006.01)
G01P 15/08     (2006.01)
G01P 15/125    (2006.01)
```
(52) U.S. Cl.
CPC .......... G01P 15/125 (2013.01); B81B 3/0072 (2013.01); G01P 15/0802 (2013.01)

(58) Field of Classification Search
CPC ............ G01P 15/0802; G01P 15/125; G01P 2015/0882; B81B 3/0072; B81B 7/0009; B81B 7/0019
USPC .................. 73/504.12; 361/761; 257/E23.07
See application file for complete search history.

(56) References Cited

U.S. PATENT DOCUMENTS

| | | | |
|---|---|---|---|
| 5,987,989 A | 11/1999 | Yamamoto et al. | |
| 6,240,782 B1 | 6/2001 | Kato et al. | |
| 8,418,558 B2 | 4/2013 | Kazama et al. | |
| 2002/0170355 A1* | 11/2002 | Malametz | G01N 9/14 73/305 |
| 2009/0007661 A1* | 1/2009 | Nasiri | G01P 1/023 73/504.03 |
| 2009/0255339 A1* | 10/2009 | McNeil | B81B 3/0072 73/514.15 |
| 2010/0236327 A1* | 9/2010 | Mao | G01C 19/5719 73/504.12 |
| 2010/0300205 A1 | 12/2010 | Kazama et al. | |
| 2014/0146500 A1* | 5/2014 | Shimizu | H05K 1/185 361/761 |
| 2015/0014799 A1 | 1/2015 | Tanaka | |

FOREIGN PATENT DOCUMENTS

| | | |
|---|---|---|
| CN | 104280051 A | 1/2015 |
| JP | 09-211022 | 8/1997 |
| JP | 2000187040 A * | 7/2000 |

(Continued)

OTHER PUBLICATIONS

English translation of JP 2000187040 A.*

*Primary Examiner* — Jonathan M Dunlap
*Assistant Examiner* — Irving A Campbell
(74) *Attorney, Agent, or Firm* — Harness, Dickey & Pierce, P.L.C.

(57) ABSTRACT

A physical quantity sensor includes a first sensor element, an outer edge portion arranged on at least a portion of the outer periphery of the first sensor element, in which a first groove portion extending in a first direction is provided on the outer edge portion when the outer edge portion is seen in plan view.

23 Claims, 15 Drawing Sheets

(56) References Cited

FOREIGN PATENT DOCUMENTS

| | | |
|---|---|---|
| JP | 2007-279056 A | 10/2007 |
| JP | 2008-185369 A | 8/2008 |
| JP | 2009-014488 A | 1/2009 |
| JP | 2009-224462 A | 10/2009 |
| JP | 2010-276508 A | 12/2010 |
| JP | 2013-019906 | 1/2013 |
| JP | 2013-062339 A | 4/2013 |
| JP | 2013-525797 A | 6/2013 |
| JP | 2013-529300 A | 7/2013 |
| JP | 2013-532273 A | 8/2013 |
| JP | 2013-533461 A | 8/2013 |
| WO | WO-2011-136960 A1 | 11/2011 |
| WO | WO-2011-136969 A1 | 11/2011 |
| WO | WO-2011-136971 A1 | 11/2011 |
| WO | WO-2011-136972 A1 | 11/2011 |

\* cited by examiner

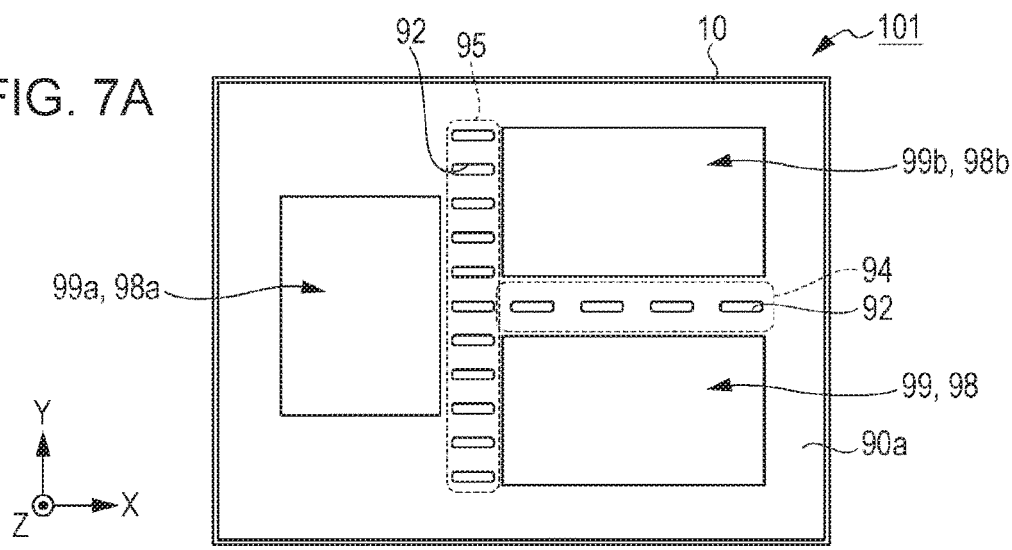
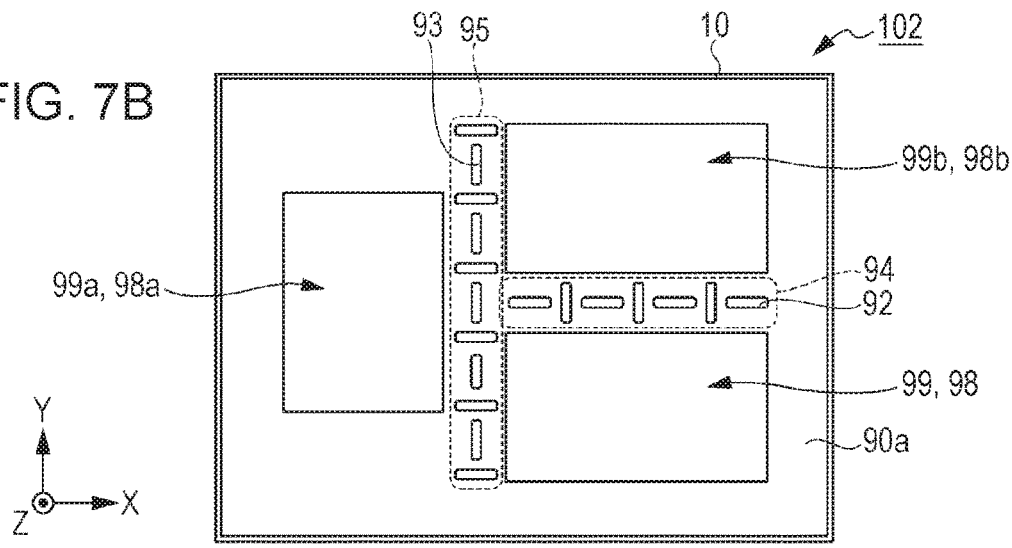
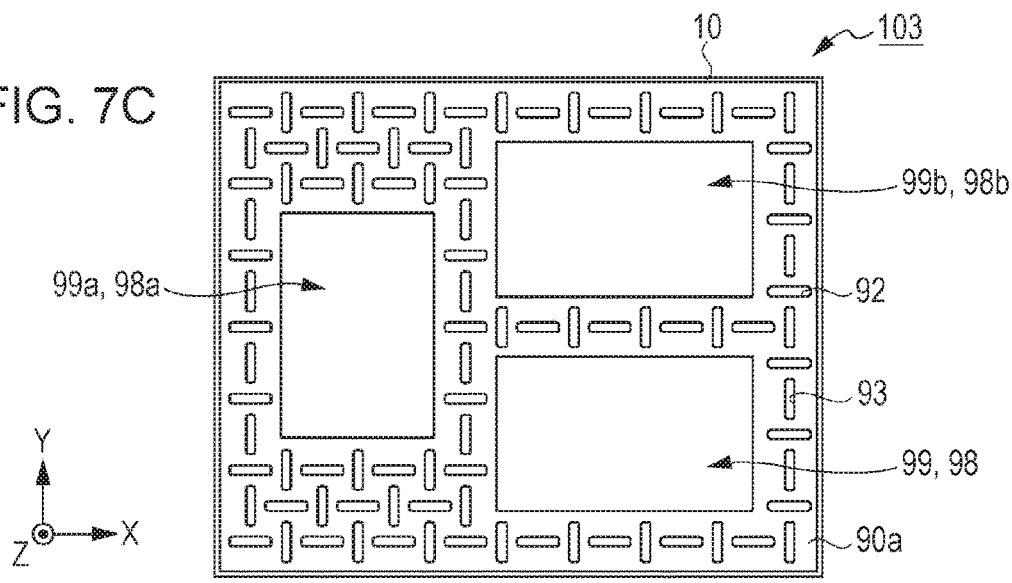

ELECTRONIC DEVICE, METHOD OF MANUFACTURING ELECTRONIC DEVICE, PHYSICAL QUANTITY SENSOR, ELECTRONIC APPARATUS AND MOVING OBJECT

BACKGROUND

1. Technical Field

The present invention relates to an electronic device, a method of manufacturing an electronic device, a physical quantity sensor, an electronic apparatus and a moving object.

2. Related Art

Physical quantity sensors as electromechanical structures provided with a mechanically movable structure are generally known. For example, movable electrodes that displace according to the action of a physical quantity (such as acceleration and angular velocity) and capacitive sensors that detect a physical quantity based on the capacitance between fixed electrodes facing the movable electrode are known as physical quantity sensors (for example, the semiconductor dynamic sensor disclosed in JP-A-09-211022). Such a physical quantity sensor is formed from a substrate for support, a sensor element provided on the element (such as a fixed electrode, a fixed portion (anchor portion), a support unit extending from the fixed portion, and a movable electrode supported while isolated from the substrate by the support unit), and the like. The sensor element is obtained by precision working through photoetching or the like of a semiconductor substrate (such as a silicon substrate) adhered to the substrate (such as a glass substrate).

There are cases of parasitic capacitance formed in the configuration of the sensor element causing the sensitivity of the sensor to be lowered in such a capacitive sensor. In contrast, in the semiconductor dynamic sensor disclosed in JP-A-2007-279056, a technology that prevents lowering of the sensor sensitivity by providing a unit (shield electrode) that fixes the potential of the outer peripheral portion arranged on the outer periphery of the sensor element is proposed.

However, in the physical quantity sensor in which the outer peripheral portion is provided on the outer periphery of the sensor element as in the semiconductor dynamic sensor disclosed in the above-described JPA-2007-279056, a problem arises that the detection characteristics as a sensor fluctuate according to the temperature and environment in which the sensor is used. Specifically, leakage vibration or leakage force, such as disturbance transferred to the movable portion (movable electrode) of the sensor element from the outer peripheral portion exerts an influence on the displacement of the movable portion (movable electrode) of the sensor element, and the detection characteristics fluctuate.

SUMMARY

The invention can be realized in the following application examples or aspects.

Application Example 1

According to this application example, there is provided an electronic device, including a first functional element; and an outer edge portion arranged on at least a portion of the outer periphery of the first functional element, in which a first groove portion in which grooves are arranged extending in a first direction or lined up along the first direction is provided on the outer edge portion when the outer edge portion is seen in plan view.

According to this application example, the electronic device is provided with a first functional element, and an outer edge portion arranged on the outer periphery of the first functional element (outer periphery when the electronic device is seen in plan view). A first groove portion arranged extending in the first direction or lined up along the first direction is included on the outer edge portion. In such a configuration, by providing the outer edge portion with a first groove portion in which grooves are arranged extending in a first direction or lined up along the first direction, the transmission of the leakage vibration or leakage force such as a disturbance transferred from the outer edge portion to the first functional element is alleviated by the first groove portion. Accordingly, it is possible to provide an electronic device with more stable electrical characteristics in which fluctuations in the electrical characteristics due to leakage vibration or leakage force such as a disturbance transferred from the outside to the first functional element are suppressed.

The groove may be a groove that penetrates the outer edge portion or may be a bottomed groove.

Application Example 2

In the electronic device according to the application example, it is preferable that a second groove portion in which the grooves are arranged extending in a second direction intersecting the first direction or lined up along the second direction is provided on the outer edge portion when the outer edge portion is seen in plan view.

According to this application example, the electronic device includes a second groove portion, in addition to the first groove portion, arranged extending in a second direction that intersects the first direction or lined up along the second direction on the outer edge portion of the first functional element. The leakage vibration or leakage force such as a disturbance transferred from the outer edge portion to the first functional element is resolved into vector components of at least either of the first direction or the second direction that intersects the first direction. By providing the first and second groove portions as in this application example, the transmission of the stress that acts, with respect to the grooves, in a direction that intersects the direction in which the grooves extend is alleviated by the grooves. Accordingly, it is possible to provide an electronic device with more stable electrical characteristics in which fluctuations in the electrical characteristics due to leakage vibration or leakage force such as a disturbance transferred from the outside to the first functional element are suppressed.

Application Example 3

In the electronic device according to the application example, it is preferable that the first and second groove portions are arranged lined up on at least one side in the outer circumference of the first functional element.

According to this application example, the first groove portion that extends or is lined up in the first direction and the second groove portion that extends or is lined up in the second direction that intersects the first direction are arranged lined up. It is possible to more effectively suppress the transmission of the leakage vibration or leakage force such as a disturbance transferred from the outer edge portion to the first functional element or the stress (distortion) in both directions that intersect the first and second groove portions by the first and second groove portions. Accordingly, it is possible to provide an electronic device with more stable electrical characteristics in which fluctuations in the electrical characteristics due to leakage vibration or leakage force such as a disturbance transferred from the outside to the first functional element are suppressed.

Application Example 4

In the electronic device according to the application example, it is preferable that a third groove portion in which the grooves are arranged extending or lined up in a direction orthogonal to the central line passing through the center of the first functional element is provided on the outer edge portion when the outer edge portion is seen in plan view.

According to this application example, it is possible to provide a groove portion in which the angle sequentially changes from a corner portion with a comparatively high distortion toward the central portion through the third groove portion in which grooves are arranged extending or lined up in a direction orthogonal to the centerline of the first functional element. In so doing, it is possible to more effectively suppress the transmission of the leakage vibration or leakage force such as a disturbance transferred from the outer edge portion to the first functional element or the stress (distortion).

Application Example 5

In the electronic device according to the application example, it is preferable that the outer edge portion is rectangular, and the third groove portion includes the grooves arranged extending or lined up in a direction orthogonal to the center line that is a diagonal line of the outer edge portion.

According to this application example, it is possible to effectively alleviate and suppress the distortion stresses imparted from the first and second directions by providing the groove portion (third groove portion) provided in a direction orthogonal to the diagonal line on a corner portion of the outer edge portion with a comparatively large distortion imparted from the first and second directions.

Because the corner portion of the outer edge portion in which the diagonal line is provided is a large distance from the center of the first functional element, the distortion (warping) due to thermal expansion or the like increases. Distortion (stress) is imparted from both of the first and second directions to the corner portion of the outer edge portion. In contrast, because the third groove portion is provided in a direction orthogonal to the diagonal line, it is possible to efficiently alleviate and suppress while dispersing distortion (stress) imparted from the first and second directions.

The third groove portion has an equivalent effect if provided in a range of approximately ±(plus or minus) 10 degrees with the above-described diagonal line as the center.

Application Example 6

In the electronic device according to the application example, it is preferable that the first functional device includes a fixed portion, a support unit that extends from the fixed portion, and a movable portion supported to be displaceable by the support unit.

According to this application example, the electronic device includes at least one of the first, second, and third groove portions on the outer edge portion arranged on the outer periphery of the first functional element. Therefore, it is possible to suppress the influence on the displacement of the movable portion and possible to suppress fluctuations in the electrical characteristics in the first functional element through the leakage vibration and the leakage force being alleviated by at least one of the first, second, and third groove portions, even in a case where the first functional element is provided with a movable portion (movable electrode), and a leakage vibration or leakage force such as a disturbance transferred to the movable portion (movable electrode) of the first functional element occurs in the outer edge portion. That is, according to this application example, it is possible for the fluctuations in the electrical characteristics to be suppressed and to be further stabilized in an electronic device provided with the movable portion.

Application Example 7

In the electronic device according to the application example, it is preferable that a second functional element is provided, in which at least one of the first, second and third groove portions is provided between the first and second functional elements.

According to this application example, the electronic device is further provided with a second functional element in addition to the first functional element. The electronic device is provided with at least one of the first, second and third groove portions on at least one of the outer circumference of the region between the first and second functional elements and the region that overlaps the outer edge portion of the substrate. Accordingly, it is possible for the transmission of energy such as stress acting between the first and second functional elements or leakage vibration transmitted from one of the first and second functional elements to the other to be alleviated by at least one of the first, second, and third groove portions, and to suppress the influence exerted on the characteristics. Specifically, worsening of the electrical characteristics in the electronic device arising due to vibration interference between the so-called plurality of functional elements, such as noise generated by one functional element exerting an influence on the other functional element in a case where the electronic device is provided with plurality of functional elements, can be prevented. This noise is not only due to electrical energy, but may be due mechanical energy such as to leakage vibration or leakage force such as a disturbance or vibration. Specifically, in a case or the like of thermal stress or residual stress that the structure of the functional element generates or has, or having a movable portion, vibration leakage and the like transmitted to the neighboring functional element is present (because the same also applies to the wording "noise" disclosed below, description will not be made below).

Application Example 8

According to this application example, there is provided an electronic device, including a first functional element; an outer edge portion arranged on at least a portion of the outer periphery of the first functional element; and a substrate, in which the first functional element is provided on a main surface of the substrate, and at least one of a first groove portion in which grooves are arranged extending or lined up in a first direction, a second groove portion in which the grooves are arranged extending or lined up in a second direction that intersects the first direction, and a third groove portion in which the grooves are arranged extending or lined up in a direction orthogonal to a center line passing through the center of the first functional element is provided on at least one of the outer edge portion and a region overlapping the outer edge portion when seen in plan view.

According to this application example, the electronic device is provided with a substrate, a first functional element provided on the main surface of the substrate, and an outer edge portion arranged on the outer periphery of the first functional element (outer periphery when the substrate is seen in plan view). At least one of the first groove portion arranged extending or lined up in the first direction, the second groove portion in which grooves are arranged in the second direction that intersects the first direction, and the third groove portion in which grooves are arranged extending or lined up in a direction orthogonal to the center line passing through the center of the first functional element is included in at least one of the outer edge portion and the region that overlaps the outer edge portion of the substrate. In such a configuration, it is possible for the outer edge portion to suppress the transmission of leakage vibration or leakage force such as a disturbance transferred from the outer edge portion to the first functional element by at least one of the first, second, and third groove portions being provided on the outer edge portion. Accordingly, it is possible to provide an electronic device with more stable electrical characteristics in which fluctuations in the electrical characteristics due to leakage vibration or leakage force such as a disturbance transferred from the outside to the first functional element or fluctuations in the electrical characteristics due to temperature changes in the environment in which the device is used are suppressed.

The groove may be a groove that penetrates at least one of the outer edge portion and the substrate or may be a bottomed groove.

Specifically, the thermal stress arising between the substrate and the outer edge portion on the main surface of the substrate is alleviated by at least one of the first, second, and third groove portions. In a case where the substrate is warped by the thermal stress, the warping is alleviated by at least one of the first, second, and third groove portions. As a result, thermal stress generated due to differences in the coefficient of thermal expansion causing the first functional element to be deformed or exerting an influence on the displacement of the movable portion in a case where the first functional element is provided with a movable portion (movable electrode) is suppressed, and fluctuations in the detection characteristics due to temperature changes in the environment in which the first functional element is used are suppressed. That is, according to this application example, it is possible to provide an electronic device with more stable electrical characteristics in which fluctuations in the electrical characteristics due to temperature changes in the environment in which the device is used while blocking or lowering leaking of signals that the first functional element detects.

Application Example 9

In the electronic device according to the application example, it is preferable that the first functional device includes a fixed portion, a support unit that extends from the fixed portion, and a movable portion supported to be displaceable by the support unit.

According to this application example, the electronic device includes at least one of the first, second, and third groove portions on the outer edge portion arranged on the outer periphery of the first functional element. Therefore, it is possible to suppress the influence on the displacement of the movable portion and possible to suppress fluctuations in the electrical characteristics in the first functional element through the leakage vibration and the leakage force being alleviated by at least one of the first, second, and third groove portions, even in a case where the first functional element is provided with a movable portion (movable electrode), and a leakage vibration or leakage force such as a disturbance transferred to the movable portion (movable electrode) of the first functional element occurs in the outer edge portion. That is, according to this application example, it is possible for the fluctuations in the electrical characteristics to be suppressed and to be further stabilized in an electronic device provided with the movable portion.

Application Example 10

In the electronic device according to the application example, it is preferable that fixed portion is fixed on the main surface of the substrate, and the movable portion is supported to be displaceable while isolated from the substrate by the support unit.

According to this application example, the outer edge portion arranged on the outer periphery of the first functional element supported via the support portion on the substrate includes at least one of the first, second, and third groove portions. Therefore, it is possible to suppress the influence on the displacement of the movable portion and possible to suppress fluctuations in the electrical characteristics due to temperature changes in the environment in which the first functional element is used through warping or thermal stress being alleviated by at least one of the first, second, and third groove portions, even in a case where the first functional element is provided with a movable portion (movable electrode), and thermal stress or deformation due to thermal stress arises. That is, according to this application example, it is possible for the fluctuations in the electrical characteristics due to temperature changes in the environment in which the device is used to be suppressed and to be further stabilized in an electronic device provided with the movable portion.

Application Example 11

In the electronic device according to the application example, it is preferable that a second functional element is provided on the main surface of the substrate, in which at least one of the first, second and third groove portions is provided between the first and second functional elements.

According to this application example, the electronic device is further provided with a second functional element in addition to the first functional element provided on the main surface of the substrate. The electronic device is provided with at least one of the first, second and third groove portions on at least one of the outer circumference of the region between the first and second functional elements and the region that overlaps the outer edge portion of the substrate. Accordingly, it is possible for the transmission of energy such as stress acting between the first and second functional elements or leakage vibration transmitted from one to the other to be alleviated by at least one of the first, second, and third groove portions, and to suppress the influence exerted on the characteristics. Specifically, the electrical characteristics as an electronic device can be prevented from being worsened due to noise generated by one functional element exerting an influence on the other functional element in a case where a plurality of functional elements is provided on a shared substrate.

Application Example 12

In electronic device according to the application example, it is preferable that the first functional element and the outer edge portion are the same material.

According to this application example, the first functional element and the outer edge portion can be formed in the same step, and it is possible to achieve simplification of the structure by forming the first functional element and the outer edge portion with the same material.

Application Example 13

In the electronic device according to the application example, it is preferable that the first direction is the direction in which the movable portion is displaced in plan view of the first functional element.

According to this application example, the first direction is the displacement direction of the movable portion provided in the first functional element (displacement direction in plan view of the substrate). That is, the outer edge portion arranged on the outer periphery of the first functional element is provided with the first groove portion extending in the same direction as the direction in which the movable portion provided in the first functional element displaces, the second groove portion extending in a direction that intersects the direction in which the movable portion provided in the first functional element displaces, and the third groove portion in which grooves are arranged extending or lined up in a direction orthogonal to the center line passing through the center of the first functional element when the first functional element is seen in plan view. In so doing, it is possible to suppress the transmission of leakage vibration or leakage vibration such as disturbance transferred from the outer edge portion to the movable portion (movable electrode) of the first functional element by at least one of the first, second, and third groove portions. In so doing, it is possible to provide an electronic device with more stable electrical characteristics in which fluctuations in the electrical characteristics due to leakage vibration or leakage force such as a disturbance transferred from the outside to the first functional element while blocking or reducing the leaking of signals that the first functional element detects or noise imparted on the first functional element from the outside.

In a case where the outer edge portion has a different coefficient of thermal expansion to the coefficient of thermal expansion of the substrate, because the outer edge portion is provided with the second groove portion that extends in a direction intersecting the displacement direction of the movable portion provided in the first functional element, it is possible to more effectively alleviate the thermal stress arising in the displacement direction of the movable portion. In particular, the thermal stress is more effectively alleviated in a case where the second groove portion extends intersecting a direction at a right angle to the displacement direction of the movable portion. The thermal stress itself that the substrate receives from the outer edge portion is suppressed by the outer edge portion being provided with the first groove portion. Specifically, because the bonding area between the substrate and the outer edge portion is reduced in the displacement direction of the movable portion due to the outer edge portion being provided with a first groove portion that extends in the displacement direction of the movable portion provided in the first functional element, the thermal stress itself generated in the displacement direction of the movable portion and that the substrate receives from the outer edge portion is suppressed. As a result, thermal stress generated due to differences in the coefficient of thermal expansion causing the first functional element to be deformed or exerting an influence on the displacement of the movable portion in a case where the first functional element is provided with a movable portion (movable electrode) is suppressed. In so doing, fluctuations in the electrical characteristics of the electronic device due to temperature changes in the environment in which the first functional element is used are suppressed.

Application Example 14

In the electronic device according to the application example, it is preferable that the shape configured by the first, second, and third groove portions is arranged to as to be rotationally symmetrical when the first functional element is seen in plan view.

According to this application example, it is possible to more effectively suppress transmission of the leakage vibration or the leakage force such as a disturbance transferred from the outer edge portion to the movable portion (movable electrode) of the first functional element and it is possible to more effectively suppress fluctuations in the detection characteristics due to temperature changes by arranging the first, second, and third groove portions so that the shape configured by the first, second, and third groove portions is rotationally symmetrical when the first functional element is seen in plan view.

Specifically, the shape configured by the first and second groove portions able to alleviate eternal stresses, thermal stress or the like is configured so as to be rotationally symmetrical when the first functional element is seen in plan view. That is, the effect of alleviating external stresses, thermal stress or the like achieves a balance at least between overlapping regions as rotational symmetry. Accordingly, even in a case where warping or the like occurs in the substrate, the stress balance is broken, the occurrence of unintentional distortion and the like is reduced, and it is possible to more stably alleviate stress. The wording "arranged so as to be rotationally symmetrical" signifies being arranged in n+1 rotation rotational symmetry, in natural numbers n.

Application Example 15

In the electronic device according to the application example, it is preferable that at least one of the first, second, and third groove portions penetrates the outer edge portion or the substrate in the thickness direction of the first functional element.

As in the application example, by providing at least one of the first, second, and third groove portions penetrating the outer edge portion or the substrate in the thickness direction of the first functional element, it is possible to more effectively suppress fluctuations in the detection characteristics due to temperature changes. Specifically, in the above-described stress alleviation effect, because the grooves that alleviate the stress (at least one of the first, second, and third groove portions) is formed as grooves that penetrate the outer edge portion or the substrate, there is no outer edge portion or substrate remaining as a bottom portion of the grooves (residual bottom portion); Accordingly, there is no stress transmitted in the residual bottom portion. By causing the groove to penetrate, it is possible to further reduce the magnitude of the thermal stress itself occurring due to difference in the coefficient of thermal expansion between the substrate and the outer edge portion because the bonding area between the substrate and the outer edge portion is reduced. As a result, it is possible to more effectively alleviate thermal stress and it is possible to more effectively suppress fluctuations in the electrical characteristics of the electronic device due to temperature changes.

Application Example 16

In the electronic device according to the application example, it is preferable that the outer edge portion is configured by a fixed potential.

According to this application example, because the outer edge portion is configured with a fixed potential, it is possible to more effectively obtain a shield effect.

Application Example 17

In the electronic device according to the application example, it is preferable that the groove portion is a groove group that includes a plurality of the grooves.

According to this application example, even if the groove portion is configured by a plurality of grooves, it is possible to suppress fluctuations in the electrical characteristics due to leakage vibration or leakage force such as a disturbance.

Application Example 18

According to this application example, there is provided a method of manufacturing the electronic device, including forming a recessed portion in the substrate; bonding a functional element substrate to the substrate while facing the recessed portion; and performing patterning work on the functional element substrate, and forming a functional element and an outer edge portion, a first groove portion in which grooves are arranged extending or lined up in a first direction and a second groove portion in which the grooves are arranged extending or lined up in a second direction that intersects the first direction in the outer edge portion.

According to this application example, the functional element substrate is bonded facing the recessed portion formed in the substrate, and thereafter the functional element substrate is subjected to patterning work, and the functional element, the outer edge portion, and the first groove portion arranged extending or lined up in the first direction and the second groove portion formed extending or lined up in the second direction that intersects the first direction are formed on the outer edge portion. In this way, it is possible to form, from the functional element substrate bonded to the substrate, the functional element, the outer edge portion, the first groove portion and the second groove portion in the same step. In other words, it is possible to easily form the functional element, the outer edge portion, the first groove portion, and the second groove portion.

Application Example 19

According to this application example, there is provided a physical quantity sensor, including a first sensor element; and an outer edge portion arranged on at least a portion of the outer periphery of the first sensor element, in which a first groove portion in which grooves are arranged extending in a first direction or lined up along the first direction is provided on the outer edge portion when the outer edge portion is seen in plan view.

According to this application example, the physical quantity sensor is provided with a first sensor element and an outer edge portion arranged on the outer periphery (outer periphery when the substrate is seen in plan view) of the first sensor element. A first groove portion arranged extending in the first direction or lined up along the first direction is included on the outer edge portion. In such a configuration, it is possible for the outer edge portion to be configured as a shield electrode having an effect of blocking or reducing leakage of signals that the first sensor element detects or noise imparted from the outside to the first sensor element. In a case of configuring the outer edge portion as the shield electrode, it is more effective for the periphery of the first sensor element to encompass a wider area. As in the application example, by providing the outer edge portion with a first groove portion in which grooves are arranged extending or lined up in the first direction, the transmission of the leakage vibration or leakage force such as a disturbance transferred from the outer edge portion to the first functional element is alleviated by the first groove portion. Accordingly, the periphery of the first sensor element can encompass a wider area. In so doing, it is possible to provide a physical quantity sensor with more stable electrical characteristics in which fluctuations in the electrical characteristics due to leakage vibration or leakage force such as a disturbance transferred from the outside to the first sensor element are suppressed.

The groove may be a groove that penetrates the outer edge portion or may be a bottomed groove.

Application Example 20

In the physical quantity sensor according to the application example, it is preferable that a second groove portion is provided in which the grooves are arranged extending in a second direction intersecting the first direction or lined up along the second direction is provided on the outer edge portion when the outer edge portion is seen in plan view.

According to this application example, the physical quantity sensor includes a second groove portion arranged extending or lined up in the second direction that intersects the first direction in addition to the first groove portion arranged extending in the first direction or lined up along the second direction on the outer edge portion of the first sensor element. The leakage vibration or leakage force such as a disturbance transferred from the outer edge portion to the first sensor element is resolved into vector components of at least either of the first direction or the second direction that intersects the first direction. The transmission of the stress acting in the direction that intersects the direction in which the grooves extend or the direction in which the grooves are lined up with respect to the first or second groove portions by providing the first groove portion arranged extending or lined up in the first direction and the second groove portion arranged extending or lined up in the second direction that intersects the first direction as in this application example. Accordingly, it is possible to provide a physical quantity sensor with more stable electrical characteristics in which fluctuations in the electrical characteristics due to leakage vibration or leakage force such as a disturbance transferred from the outside to the first sensor element are suppressed.

Application Example 21

In the physical quantity sensor according to the application example, it is preferable that the first and second groove portions are arranged lined up on at least one side in the outer periphery of the first sensor element.

According to this application example, the first groove portion that extends or is lined up in the first direction and the second groove portion that extends or is lined up in the second direction that intersects the first direction are arranged lined up in the physical quantity sensor. It is possible to suppress the transmission of the leakage vibration or leakage force such as a disturbance transferred from the outer edge portion to the first sensor element or the stress (distortion) in both directions that intersect the first and second groove portions by the first and second groove portions. Accordingly, it is possible to provide a physical quantity sensor with more stable electrical characteristics in which fluctuations in the electrical characteristics due to leakage vibration or leakage force such as a disturbance transferred from the outside to the first sensor element are suppressed.

Application Example 22

In the physical quantity sensor according to the application example, it is preferable that a third groove portion in which the grooves are arranged extending or lined up in a direction orthogonal to the central line passing through the center of the first sensor element is provided on the outer edge portion when the outer edge portion is seen in plan view.

According to this application example, it is possible for the physical quantity sensor to be provided with a groove portion in which the angle sequentially changes from a corner portion with a comparatively high distortion toward the central portion through the third groove portion in which grooves are arranged extending or lined up in a direction orthogonal to the centerline of the first sensor element. In so doing, it is possible to more effectively suppress the transmission of the leakage vibration or leakage force such as a disturbance transferred from the outer edge portion to the first sensor element or the stress (distortion).

Application Example 23

In the physical quantity sensor according to the application example, it is preferable that the groove portion is a groove group that includes a plurality of the grooves.

According to this application example, even if the groove portion is configured with a plurality of grooves, it is possible obtain a shield effect that blocks or reduces noised imparted from the outside to the sensor element.

Application Example 24

According to this application example, there is provided a physical quantity sensor, including a first sensor element; an outer edge portion arranged on at least a portion of the outer periphery of the first sensor element; and a substrate, in which the first sensor element is provided on a main surface of the substrate, and at least one of a first groove portion in which grooves are arranged extending or lined up in a first direction, a second groove portion in which the grooves are arranged extending or lined up in a second direction that intersects the first direction, and a third groove portion in which the grooves are arranged extending or lined up in a direction orthogonal to a center line passing through the center of the first sensor element is provided on at least one of the outer edge portion and a region overlapping the outer edge portion when seen in plan view.

According to this application example, the physical quantity sensor is provided with a substrate, a first sensor element provided on the main surface of the substrate, and an outer edge portion arranged on the outer periphery of the first sensor element (outer periphery when the substrate is seen in plan view). At least one of the first groove portion in which grooves are arranged extending or lined up in the first direction, the second groove portion in which grooves are arranged in the second direction that intersects the first direction, and the third groove portion in which grooves are arranged extending or lined up in a direction orthogonal to the center line passing through the center of the first sensor element is included in at least one of the outer edge portion and the region that overlaps the outer edge portion of the substrate. Through such a groove portion configuration, it is possible to suppress the transmission of leakage vibration or leakage force such as a disturbance transferred from the outer edge portion to the first sensor element, and possible to alleviate the thermal stress generated in a case of the outer edge portion and the substrate having different coefficients of thermal expansion. In so doing, it is possible to provide a physical quantity sensor with more stable electrical characteristics in which fluctuations in the electrical characteristics due to leakage vibration or leakage force such as a disturbance transferred from the outside to the first sensor element or fluctuations in the electrical characteristics due to temperature changes in the environment in which the sensor is used are suppressed.

Specifically, the thermal stress arising between the substrate and the outer edge portion on the main surface of the substrate is alleviated by at least one of the first, second, and third groove portions. For example, in a case where the substrate is warped by the thermal stress, the warping is alleviated by at least one of the first, second, and third groove portions. As a result, thermal stress generated due to differences in the coefficient of thermal expansion causing the first sensor element to be deformed or exerting an influence on the displacement of the movable portion in a case where the first sensor element is provided with a movable portion (movable electrode) is suppressed, and fluctuations in the detection characteristics due to temperature changes in the environment in which the first sensor element is used are suppressed. That is, according to this application example, it is possible to provide a physical quantity sensor with more stable electrical characteristics in which fluctuations in the electrical characteristics due to temperature changes in the environment in which the sensor is used while blocking or lowering leaking of signals that the first sensor element detects.

The groove may be a groove that penetrates at least one of the outer edge portion and the substrate or may be a bottomed groove.

Application Example 25

In the physical quantity sensor according to the application example, it is preferable that a second sensor element is provided, in which at least one of the first, second and third groove portions is provided between the first and second sensor elements.

According to this application example, the physical quantity sensor is further provided with a second sensor element in addition to the first sensor element. The physical quantity sensor is provided with the first, second, and third groove portions in the outer circumference of the region between the first sensor element and the second sensor element. Accordingly, it is possible for the transmission of energy such as stress acting between the first and second sensor elements or leakage vibration transmitted from one of the first and second sensor elements to the other to be alleviated by at least one of the first, second, and third groove portions, and to reduce the influence exerted on the characteristics. Specifically, worsening of the electrical characteristics in the physical quantity sensor arising due to vibration interference between the so-called plurality of sensor elements, such as noise generated by one sensor element exerting an influence on the other sensor element in a case where the physical quantity sensor is provided with plurality of sensor elements, can be prevented.

Application Example 26

According to this application example, there is provided an electronic apparatus including the electronic device of the above application examples.

According to this application example, it is possible to provide an electronic apparatus with more stable temperature characteristics, by providing an electronic device in which fluctuations in the detection characteristics due to temperature changes in the environment in which the device is used are suppressed, and which has more stable detection characteristics.

Application Example 27

According to this application example, there is provided a moving object provided with the electronic device according to the above-described application examples.

According to this application example, it is possible to provide a moving object with more stable environmental characteristics such as temperature changes, by providing an electronic device in which fluctuations in the detection characteristics due to temperature changes in the environment in which the device is used are suppressed, and which has more stable detection characteristics.

BRIEF DESCRIPTION OF THE DRAWINGS

The invention will be described with reference to the accompanying drawings, wherein like numbers reference like elements.

FIGS. 7A to 7C are plan views schematically showing Modification Examples 6 to 8 of the physical quantity sensor according to Embodiment 2 of the electronic device.

DESCRIPTION OF EXEMPLARY EMBODIMENTS

Hereinafter, specific embodiments of the invention will be described with reference to the drawings. The following is one embodiment of the invention; however, the invention is not limited thereto. Here, in each of the following diagrams, for convenience of description, there are cases where the scale used in the description is different from that actually used.

Embodiment 1

Figure 1A:
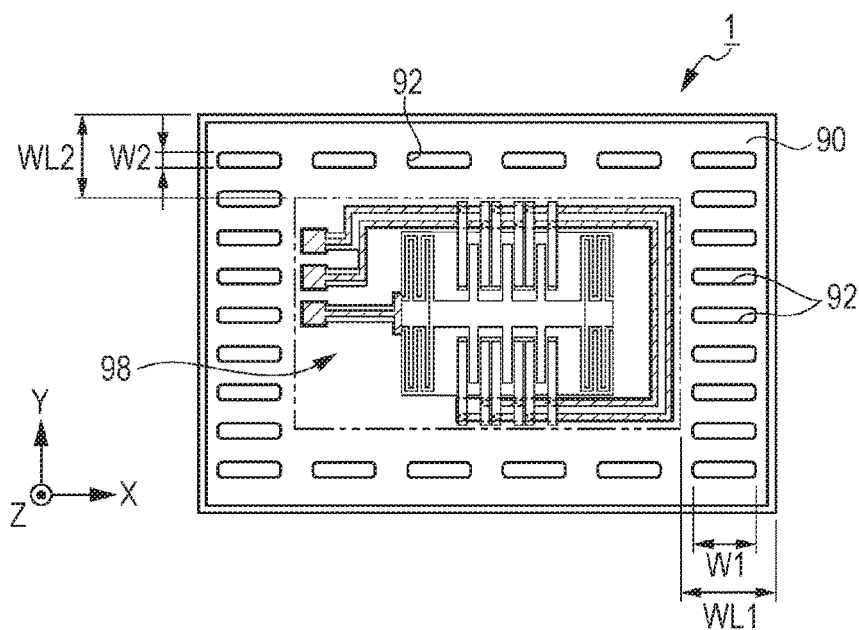
FIGS. 1A to 1C are schematic views showing a physical quantity sensor according to Embodiment 1 of an electronic device.
Figure 1B:
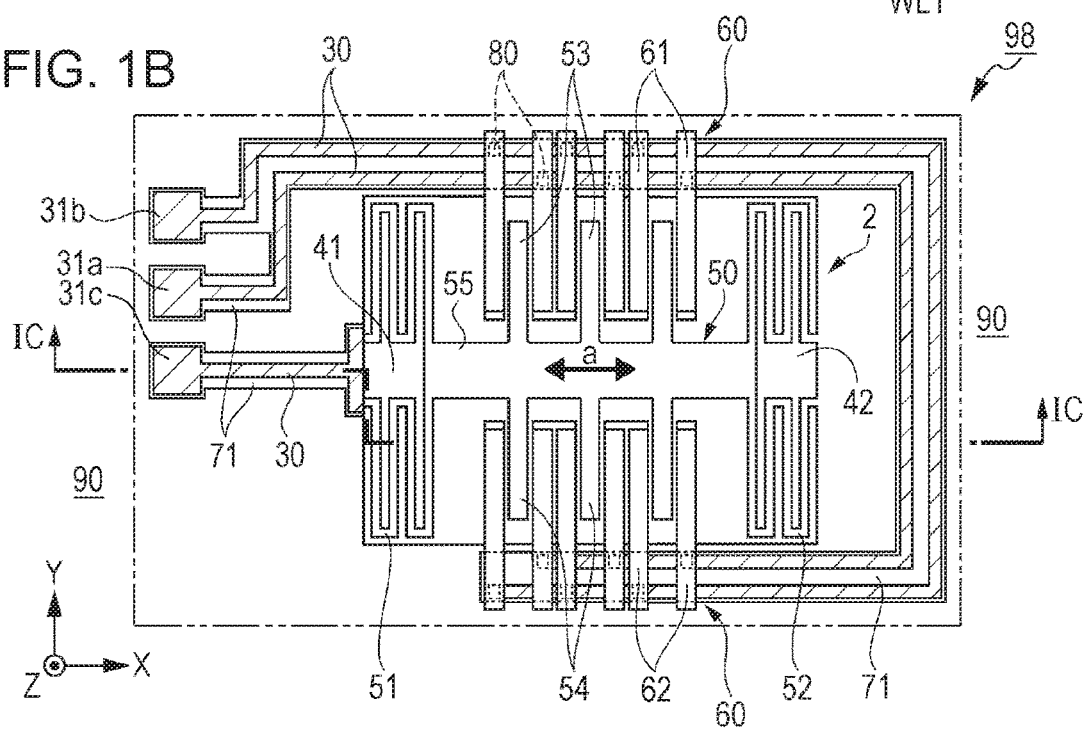
Figure 1C:
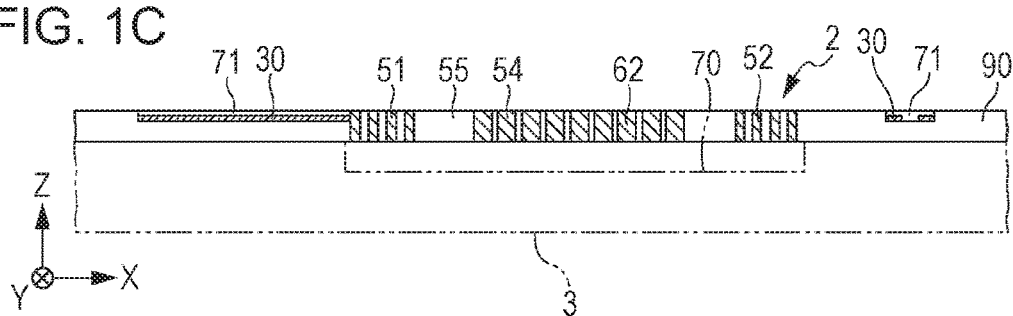

First, the physical quantity sensor according to Embodiment 1 of the electronic device will be described. FIGS. 1A to 1C are schematic views showing the physical quantity sensor according to Embodiment 1 of the electronic device, where FIG. 1A is a plan view, FIG. 1B is a plan view of a first sensor element as an example of a sensor unit provided in the physical quantity sensor, and FIG. 1C is a cross-sectional view taken along line IC-IC in FIG. 1B. Below, for convenience of description, on the XYZ axes denoted in the drawings, the X direction is the right direction, the X-axis direction (±X direction) is the horizontal direction, the Y direction is the inward direction, the Y-axis direction (±Y direction) is the front/rear direction, the Z direction is the upward direction, and the Z-axis direction (±Z direction) is the vertical direction in the direction.

Configuration of Physical Quantity Sensor

The physical quantity sensor 1 is provided with a first sensor element (first functional element) 98 as a sensor unit and an outer edge portion 90, and the like. The sensor element 98 is provided with a sensing unit 2, a wiring 30 and the like. The sensing unit 2 is provided with a movable electrode 50 as a movable portion, a fixed electrode 60 and the like. The movable electrode 50 is provided with fixed portions 41 and 42, support portions 51 and 52, extending from the fixed portion 41, and movable electrode fingers 53 and 54, a movable base portion 55 and the like. The first sensor element (first functional element) 98 that configures the sensor unit and the outer edge portion 90 are formed from the same material. The configuration in which the first sensor element (first functional element) 98 and the outer edge portion 90 are formed with the same material can easily form the physical quantity sensor 1, compared to a configuration in which the first sensor element (first functional element) 98 and the outer edge portion 90 are separately formed. The physical quantity sensor 1 may be bonded to a plate shaped substrate 3 as a member-to-be-bonded. The substrate 3 is provided with a recessed portion 70 on the upper surface thereof as the main surface. It is preferable that the recessed portion 70 is formed in a region within which the movable electrode 50 (support portions 51 and 52, movable electrode fingers 53 and 54, and movable base portion 55) of the sensing unit 2 falls when the first sensor element 98 is seen in plan view. The recessed portion 70 is formed as an escape portion for causing the movable electrode 50 (support portions 51 and 52, movable electrode fingers 53 and 54, and movable base portion 55) to be isolated from the substrate 3.

The movable base portion 55 is rectangular plate-shaped body in which the long direction faces the X direction, and is supported via the support portions 51 and 52 between the outer edge portions 90. More specifically, the end portion of the movable base portion 55 on the left side in the drawing is connected to the outer edge portion 90 via the support portion 51, and the end portion of the movable base portion 55 on the right side in the drawing is connected to the outer edge portion 90 via the support portion 52.

A plurality (in the embodiment, three) of beam-like movable electrode fingers 53 extend in the +Y direction from the long side part on the +Y side of the movable base portion 55 and a plurality (in the embodiment, three) of beam-like movable electrode fingers 54 extends in the −Y direction from the long edge part on the −Y side of the movable base portion 55.

The support portions 51 and 52 are connected to the movable base portion 55 to be displaceable with respect to the outer edge portion 90. In the embodiment, as shown by the arrow a in FIG. 1B, the support portions 51 and 52 are configured so that the movable base portion 55 is able to displace in the X-axis direction.

The plurality of movable electrode fingers 53 and the plurality of movable electrode fingers 54 that extend in the Y-axis direction are provided lined up in the X-axis direction in which the movable electrode 50 displaces.

The support portion 51 is, specifically, configured by two (a pair) of beams, and each forms a shape that extends in the +X direction while meandering in the Y-axis direction. In other words, each of the beams is formed folded back a plurality (in the embodiment, three times) of times in the Y-axis direction. The number of times each beam is folded back may be one or two times, or may be four or more times.

The support portion 52 is also similarly formed by a pair of beams that form a shape extending in the −X direction while meandering in the Y-axis direction.

The fixed electrode 60 is provided with a plurality of fixed electrode fingers 61 and 62 lined up so as to form a pectinate shape that mesh while spaced with a gap with the plurality of movable electrode fingers 53 and 54 of the movable electrode 50.

The fixed electrode fingers 61 are arranged a pair at a time facing both sides of the in the X-axis direction so to interpose one of the movable electrode fingers 53 spaced by a gap. In other words, a pair of fixed electrode fingers 61, that is, two fixed electrode fingers 61, is arranged at three locations. Similarly, the fixed electrode fingers 62 are arranged a pair at a time facing both sides of the in the X-axis direction so as to interpose one of the movable electrode fingers 54 spaced by a gap. In other words, a pair of fixed electrode fingers 62, that is, two fixed electrode fingers 62, is arranged at three locations.

One end portion of each of the fixed electrode fingers 61 and 62 is bonded to the region on the outer edge portion 90 side of the first sensor element 98, when the first sensor element 98 is seen in plan view, on the main surface of the first sensor element 98 (physical quantity sensor 1). Specifically, each end portion of the fixed electrode finger 61 on the opposite side (+Y side with respect to the movable electrode 50) to the movable electrode 50 side is bonded to the outer edge portion 90 side of the first sensor element 98. Each fixed electrode finger 61 includes an end on the fixed side thereof as the fixed side, and a free side that extends in the −Y direction. Similarly, each the end portion of the fixed electrode finger 62 on the opposite side (−Y side with respect to the movable electrode 50) to the movable electrode 50 side is bonded to the outer edge portion 90 side of the first sensor element 98, and the fixed electrode fingers include an end on the fixed side thereof as the fixed end and a free end that extends in the +Y direction.

Through such a configuration, it is possible for the capacitance between the fixed electrode finger 61 positioned on the +X side of the movable electrode finger 53 between the fixed electrode fingers 61 (below, referred to as the first fixed electrode finger) and the movable electrode finger 53 and the capacitance between the fixed electrode finger 61 positioned on the −X side of the movable electrode finger 53 between the fixed electrode fingers 61 (below, referred to as the second fixed electrode finger) and the movable electrode finger 53 to be changed according to displacement of the movable electrode 50.

Similarly, it is possible for the capacitance between the fixed electrode finger 62 positioned on the +X side of the movable electrode finger 54 between the fixed electrode fingers 62 (below, similarly referred to as the first fixed electrode finger) and the movable electrode finger 54 and the capacitance between the fixed electrode finger 62 positioned on the −X side of the movable electrode finger 54 between the fixed electrode fingers 62 (below, similarly referred to as the second fixed electrode finger) and the movable electrode finger 54 to be changed according to displacement of the movable electrode 50.

The first fixed electrode finger and the second fixed electrode finger are isolated from one another and electrically insulated. Therefore, it is possible to separately measure the capacitance between the first fixed electrode finger and the movable electrode 50 (movable electrode fingers 53 and 54) and the capacitance between the second fixed electrode finger and the movable electrode 50 (movable electrode fingers 53 and 54) and to highly precisely detect physical quantities based on the measurement results thereof.

That is, the sensing unit 2, for example, is displaced in the X-axis direction (+X direction or −X direction) while the movable electrode 50 (movable electrode fingers 53, 54) causes the support portions 51 and 52 to be elastically deformed according to changes in physical quantities such as acceleration and angular velocity. The first sensor element 98 is able to detect physical quantities, such as acceleration or angular velocity, based on the capacitance that changes according to such displacement. That is, the first sensor element 98 is a capacitive acceleration sensor.

The shape of the movable electrode 50 and the fixed electrode 60 is determined according to the size and shape of each portion that configures the sensing unit 2, and is not limited to the above-described configuration.

The wiring 30 is an electrical connection wiring for detecting the capacitance, and is laid along the concavity 71 formed on the main surface (main surface of the first sensor element 98) of the physical quantity sensor 1. The wiring 30 includes each of a wiring that connects to the electrode 31$a$ for connecting to an external circuit electrically connected to the first fixed electrode finger, a wiring that connects to the electrode 31$b$ for connecting to an external circuit electrically connected to the second fixed electrode finger, and a wiring that connects to the electrode 31$c$ for connecting the movable electrode 50 and an external circuit. An insulating layer may be included between the wiring 30 and the concavity 71. The insulating layer is, for example, silicon dioxide ($SiO_2$) or the like. That is, the wiring 30 and the outer edge portion 90 may be electrically insulated.

The concavity 71 is provided as a region in which the wiring 30 is laid in the region on the outer edge portion 90 side of the first sensor element 98. That is, the concavity 71 is formed so that the region in which the wiring 30 is laid falls within the concavity 71 when the first sensor element 98 is seen in plan view. The depth dimension of the concavity 71 (dimension in the thickness direction of the first sensor element 98) is larger than the thickness dimension of the wiring 30, excluding the contact portion, described later. The wiring 30 and the first and second fixed electrode fingers are electrically connected by the contact portion 80.

Although it is possible to use various electrode materials as the constituent material of the wiring 30 without particular limitation as long as the material is conductive, examples thereof include oxides (transparent electrode material) such as indium tin oxide (ITO), indium zinc oxide (IZO), $In_2O_3$, $SnO_2$, Sb-containing $SnO_2$, and Al-containing ZnO, Au, Pt, Ag, Cu, and Al or alloys including these, and it is possible to use one type thereof of a combination of two or more types.

The outer edge portion 90 includes a function as a shield electrode having an effect of blocking or reducing leakage of signals that the first sensor element 98 detects or noise imparted from the outside to the first sensor element 98. The outer edge portion 90, as shown in FIG. 1A, is arranged on the outer peripheral region of the first sensor element 98 on the main surface of the physical quantity sensor 1, when the physical quantity sensor 1 is seen in plan view.

Specifically, in the center portion on the main surface of the physical quantity sensor 1, the first sensor element 98 is configured occupying a rectangular region in plan view. The outer edge portion 90 is formed in a frame shape so as to surround the first sensor element 98 in the center portion on the main surface of the physical quantity sensor 1. A fixed potential, such as a ground potential, is provided to the outer edge portion 90 through the wiring (not shown). The outer edge portion 90 has an effect as a shield electrode by setting the outer edge portion 90 to a fixed potential, such as a ground potential or a constant potential.

The outer edge portion 90 includes a plurality of first groove portions 92 that extend in the X-axis direction as a first direction when the physical quantity sensor 1 is seen in plan view. That is, the first direction in which the first groove portion 92 extends is the displacement direction of the movable portion (movable electrode 50). The first groove portion 92 is a slot (groove) that penetrates from the upper surface to the lower surface of the outer edge portion 90, and the length W1 in the X-axis direction is approximately 70% of the frame width WL of the outer edge portion 90 that forms a frame shape, and the width W2 in the Y-axis direction is approximately 10% of the frame width WL2 of the outer edge portion 90. The frame width and the width of the slot (groove) are also similarly defined in the following description. The first groove portions 92 are arranged at substantially equal intervals in the frame region of the outer edge portion 90. The size and number of first groove portions 92 is not limited to the above-described content. A configuration may be used in which the length and width are further reduced, to arrange greater numbers. However, it is necessary that the groove portions be provided in a range not impeding the effect as a shield electrode. As in the aspect, by arranging the plurality of first groove portions 92 in rows having a predetermined gap, it is possible to prevent lowering of the strength of the outer edge portion 90$a$ and to prevent lowering of the effect as a shield electrode, compared to a configuration which one groove is provided along the outer edge portion.

Silicon as an appropriate example is used as the material that configures the physical quantity sensor 1. In this way, by forming the first sensor element 98 and the outer edge portion 90 from the same material, during manufacturing thereof, the first sensor element and the outer edge portion can be formed by integrally patterning one silicon substrate, and it is possible to achieve simplification in manufacturing.

It is possible for the silicon substrate to be highly precisely worked by etching. Therefore, it is possible to have superior dimensional precision in the sensing unit 2 and the like, and as a result to achieve increased sensitivity in the first sensor element 98 by configuring the physical quantity sensor 1 from a silicon substrate as a main material.

It is preferable for the silicon material that configures the physical quantity sensor 1 to be doped with impurities such as phosphorous and boron. In so doing, it is possible for the physical quantity sensor 1 to have excellent conductivity in the first sensor element 98 (sensing unit 2) and shielding properties as the shield electrode of the outer edge portion 90.

The constituent material of the physical quantity sensor 1 is not limited to a silicon substrate, and may be a material able to detect physical quantities based on variations in the capacitance.

As described above, according to the physical quantity sensor 1 according to the embodiment, it is possible to obtain the following effects.

The physical quantity sensor 1 is provided with an outer edge portion 90 arranged on the outer periphery (outer periphery when the physical quantity sensor 1 is seen in plan view) of the first sensor element 98 as the first functional element. The first groove portion 92 is arranged extending in the first direction on the outer edge portion 90. In such a configuration, it is possible for the outer edge portion 90 to be configured as a shield electrode having an effect of blocking or reducing leakage of signals that the first sensor element 98 detects or noise imparted from the outside to the first sensor element 98. In a case of configuring the outer edge portion 90 as a shield electrode, it is more effective for the periphery of the first sensor element 98 to encompass a wider area. As in the application example, by providing the first groove portion 92 on the outer edge portion 90, the transmission of the leakage vibration or leakage force such as a disturbance transferred from the outer edge portion 90 to the first sensor element 98 is alleviated by the first groove portion 92. Accordingly, the periphery of the first sensor element 98 can encompass a wider area. In so doing, it is possible to obtain the physical quantity sensor 1 as an electronic device with more stable electrical characteristics in which fluctuations in the electrical characteristics due to leakage vibration or leakage force such as a disturbance transferred from the outside to the first sensor element 98 while having a shield effect of blocking or reducing the leaking of signals that the first sensor element 98 detects or noise imparted on the first sensor element 98 from the outside.

By forming the first sensor element 98, the outer edge portion 90, and the first groove portion 92 of the outer edge portion 90 from the same material, during manufacturing thereof, the first sensor element and the outer edge portion can be formed by integrally patterning one silicon substrate, and it is possible to simply manufacture the physical quantity sensor 1.

Modification Example of Embodiment 1

Figure 2A:
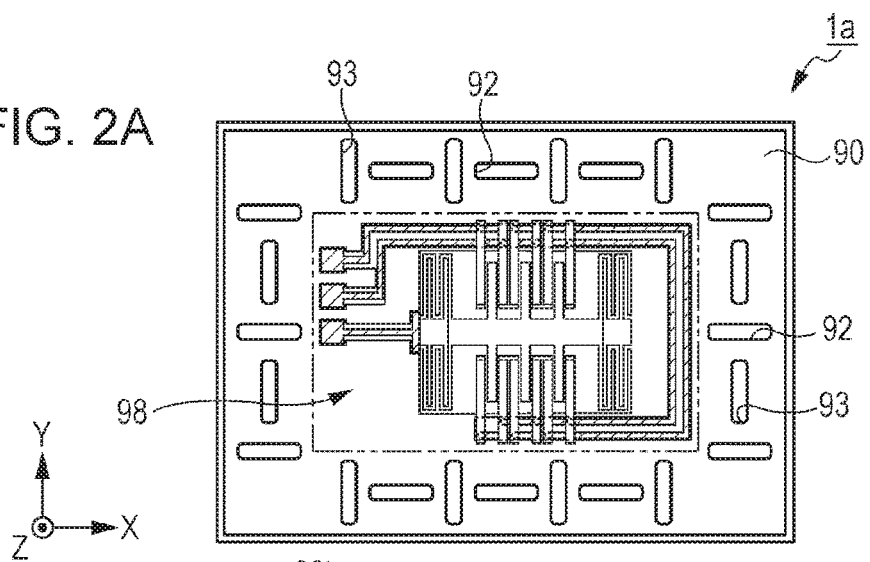
FIGS. 2A to 2C are plan views schematically showing Modification Examples 1 to 3 of the physical quantity sensor according to Embodiment 1 of the electronic device.
Figure 2B:
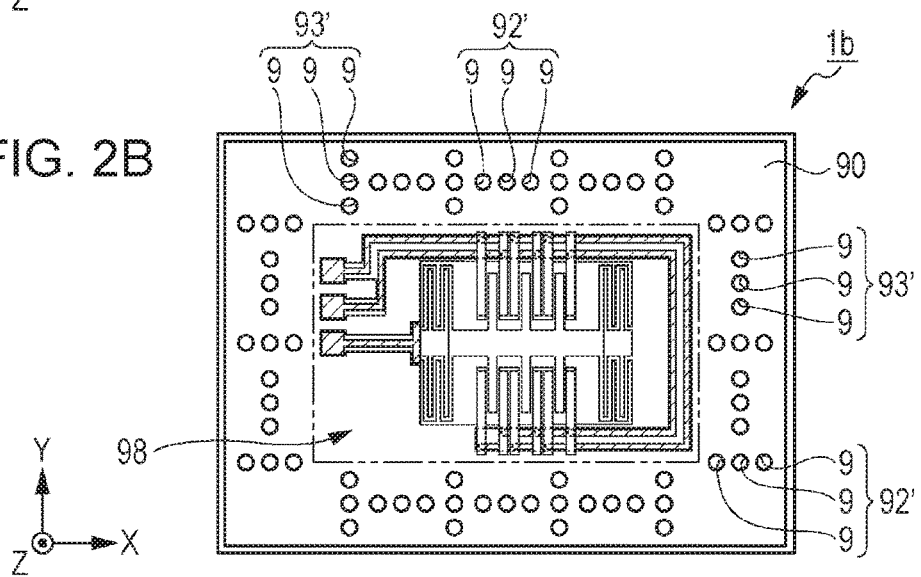
Figure 2C:
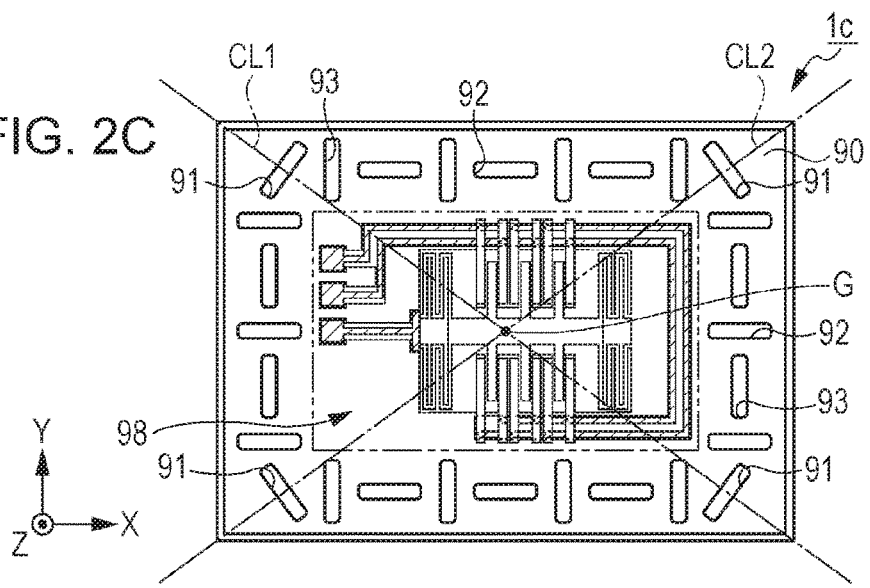
Figure 3A:
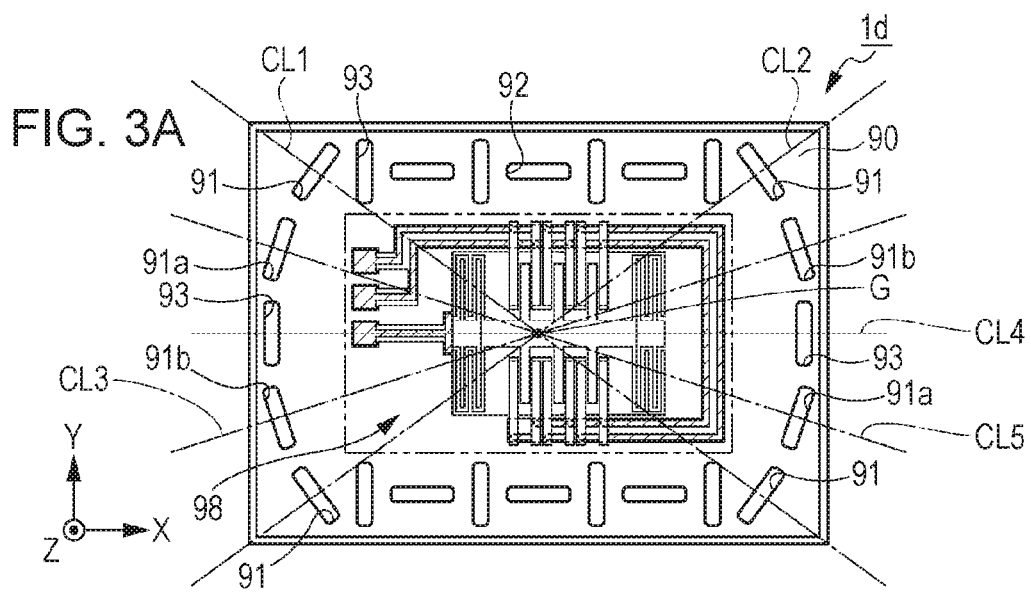
FIGS. 3A and 3B are plan views schematically showing Modification Examples 4 and 5 of the physical quantity sensor according to Embodiment 1 of the electronic device.
Figure 3B:
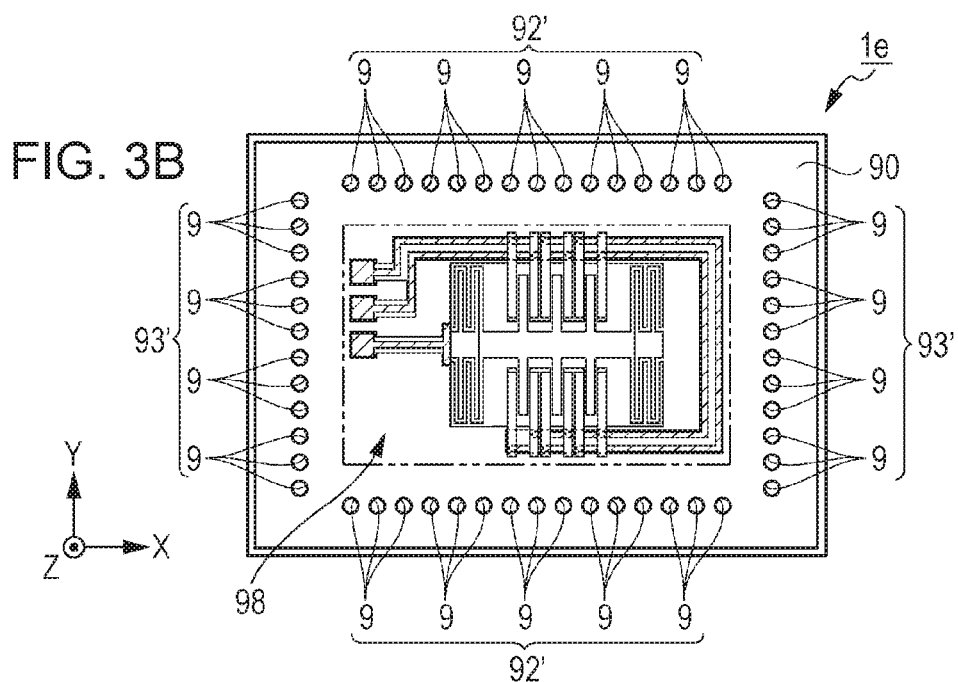
Figure 3C:
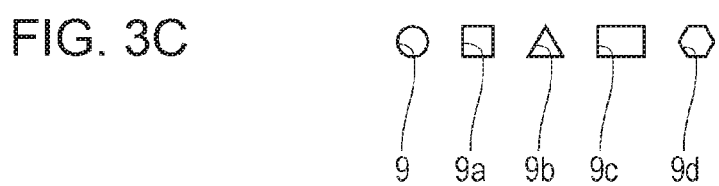
FIG. 3C is a plan view showing a modification example of the shape of the grooves.

Modification examples of the physical quantity sensor 1 according to Embodiment 1 will be described with reference to FIGS. 2A to 3C. FIGS. 2A to 2C are plan views schematically showing Modification Examples 1 to 3 of the physical quantity sensor 1 according to Embodiment 1, FIGS. 2A, 2B and 2C show Modification Examples 1, 2, and 3, respectively. FIGS. 3A to 3C are plan views schematically showing Modification Examples 4 and 5 of the physical quantity sensor 1 according to Embodiment 1, where FIGS. 3A and 3B show Modification Examples 4 and 5, respectively and FIG. 3C shows a modification example of the shape of the grooves. The physical quantity sensors 1a, 1b and 1c of the modification examples shown in FIGS. 2A to 2C and the physical quantity sensors 1d and 1e of the modification examples shown in FIGS. 3A and 3B have different configurations of the groove portions (in physical quantity sensor 1, the first groove portion 92) provided on the outer edge portion 90 to the physical quantity sensor 1 of Embodiment 1. Below, in the description of Modification Examples 1 to 5, description is provided centered on the points of difference with the physical quantity sensor 1 of the above-described Embodiment 1, the same configurations are given the same reference numerals and description thereof will not be repeated.

Modification Example 1

The physical quantity sensor 1a shown in FIG. 2A is provided with a first sensor element (first functional element) 98 as a sensor unit and an outer edge portion 90, and the like, similarly to the above-described physical quantity sensor 1. Since the first sensor element 98 is the same as that in the above-described physical quantity sensor 1, description thereof will not be repeated.

A plurality of first groove portions 92 that extend in the X-axis direction as the first direction and a plurality of second groove portions 93 that extend in the Y-axis direction as the second direction that intersects the first direction (X-axis direction) are included on the outer edge portion 90 arranged on the outer peripheral region of the first sensor element 98 when the physical quantity sensor 1a is seen in plan view. The first direction in which the first groove portion 92 extends is the displacement direction of the movable portion (movable electrode 50: refer to FIGS. 1A to 1C).

The first groove portion 92 is a slot (groove) that penetrates from the upper surface to the lower surface of the outer edge portion 90, and the length in the X-axis direction is approximately 70% of the frame width of the outer edge portion 90 that forms a frame shape, and the width in the Y-axis direction is approximately 10% of the frame width of the outer edge portion 90. The first groove portions 92 are arranged at substantially equal intervals in the frame region of the outer edge portion 90.

The second groove portion 93 is a slot (groove) that penetrates the outer edge portion 90, similarly to the first groove portion 92, and the length in the Y-axis direction is approximately 70% of the frame width of the outer edge portion 90 that forms a frame shape, and the width in the X-axis direction is approximately 10% of the frame width of the outer edge portion 90. The second groove portion 93 is arranged at substantially equal intervals lined up between or so as to alternately neighbor the first groove portions 92 arranged at substantially equal intervals. In this way, by arranging the first groove portion 92 and the second groove portion 93 lined up, it is possible to more effectively suppress transmission of the leakage vibration or leakage force such as a disturbance.

The first groove portion 92 and the second groove portion 93 are arranged so that the shape configured by the first groove portion 92 and the second groove portion 93 is two-fold rotationally symmetrical when the physical quantity sensor 1a is seen in plan view.

The size and number of first groove portions 92 and the second groove portions 93 is not limited to the above-described content. A configuration may be used in which the length and width are further reduced, to arrange greater numbers. The first and second groove portions 92 and 93 are connected, and may be configured in a cross shape, a T-shape, or an L-shape. However, it is necessary that the groove portions be provided in a range not impeding the effect as a shield electrode. It is preferable to arrange the shapes configured by the first and second groove portions 92 and 93 to be rotationally symmetrical.

According to the physical quantity sensor 1a according to Modification Example 1 includes the second groove portion 93 extending in the second direction that intersects the first direction in addition to the first groove portion 92 extending in the first direction on the outer edge portion 90 of the first sensor element 98. The leakage vibration or leakage force such as a disturbance transferred from the outer edge portion 90 to the first sensor element 98 is resolved into vector components of at least either of the first direction or the second direction that intersects the first direction. By providing the first and second groove portions 92 and 93 as in the application example, the transmission of the stress that acts, with respect to the grooves, in a direction that intersects the direction in which the grooves extend is alleviated by the grooves. Accordingly, it is possible to obtain an physical quantity sensor 1a with more stable electrical characteristics in which fluctuations in the electrical characteristics due to leakage vibration or leakage force such as a disturbance transferred from the outside to the first sensor element 98 while having a shield effect of blocking or reducing the leaking of signals that the first sensor element 98 detects or noise imparted on the first sensor element 98 from the outside.

Modification Example 2

The physical quantity sensor 1b shown in FIG. 2B is provided with a first sensor element (first functional element) 98 as a sensor unit and an outer edge portion 90, and the like, similarly to the above-described physical quantity sensor 1. Since the first sensor element 98 is the same as that in the above-described physical quantity sensor 1, description thereof will not be repeated.

The first groove group 92' in which dot-like grooves 9 are arranged lined up in the X-axis direction as the first direction and the second groove group 93' in which the dot-like grooves 9 are arranged lined up in the Y-axis direction as the second direction that intersects the first direction (X-axis direction) are included on the outer edge portion 90 arranged on the outer peripheral region of the first sensor element 98 when the physical quantity sensor 1b is seen in plan view. A plurality of first groove groups 92' and second groove groups 93' is provided. The first direction in which the first groove group 92' extends is the displacement direction of the movable portion (movable electrode 50: refer to FIGS. 1A to 1C). It is possible for the first groove group 92' and the second groove group 93' to be replaced with the first groove portion 92 and the second groove portion 93, respectively.

The dot-like grooves 9 that configure the first and second groove groups 92' and 93' are slots (grooves) that penetrate from the upper surface to the lower surface of the outer edge portion 90 and with a planar shape forming a substantial circle. The first groove group 92' configured by a plurality of dot-like grooves 9 has a length in the X-axis direction approximately 70% of the frame width of the outer edge portion 90 that forms a frame shape and a width in the Y-axis direction approximately 10% of the frame width of the outer edge portion 90. The first groove groups 92' are arranged at substantially equal intervals in the frame region of the outer edge portion 90.

The second groove group 93' configured by a plurality of dot-like grooves 9 has a length in the Y-axis direction approximately 70% of the frame width of the outer edge portion 90 that forms a frame shape and a width in the Y-axis direction approximately 10% of the frame width of the outer edge portion 90. The second groove groups 93' are arranged at substantially equal intervals lined up between or so as to alternately neighbor the first groove group 92' arranged at substantially equal intervals.

The first and second groove groups 92' and 93' are arranged so that the shape configured by the first and second groove groups 92' and 93' is two-fold rotationally symmetrical when the physical quantity sensor 1b is seen in plan view.

The number of the dot-like grooves 9 and the size and number of first and second groove groups 92' and 93' is not limited to the above-described content. For example, a configuration may be used in which the number of dot-like grooves 9 is reduced to shorten the length of the first and second groove groups 92' and 93' or the diameter of the dot-like grooves 9 may be reduced to narrow the width of the first and second groove groups 92' and 93' to arrange greater numbers. The first and second groove groups 92' and 93' are connected, and may be configured in a cross shape, a T-shape, or an L-shape. However, it is necessary that the groove portions be provided in a range not impeding the effect as a shield electrode. It is preferable to arrange the shapes configured by the first and second groove groups 92' and 93' to be rotationally symmetrical.

According to the physical quantity sensor 1b according to Modification Example 2, the first groove group 92' in which the dot-like grooves 9 are lined up in the first direction and the second groove group 93' in which the dot-like grooves 9 are arranged in the second direction that intersects the first direction are included on the outer edge portion 90 of the first sensor element 98. By providing the first and second groove groups 92' and 93' of such a configuration, similarly to Modification Example 1, the transmission of the stress that acts in the direction that intersects the extension direction of the grooves with respect to the grooves is alleviated by the first and second groove groups 92' and 93'. Accordingly, it is possible to provide physical quantity sensor 1b with more stable electrical characteristics in which fluctuations in the electrical characteristics due to leakage vibration or leakage force such as a disturbance transferred from the outside to the first sensor element 98 while having a shield effect of blocking or reducing the leaking of signals that the first sensor element 98 or noise imparted on the first sensor element 98 from the outside.

Modification Example 3

The physical quantity sensor 1c shown in FIG. 2C is provided with a first sensor element (first functional element) 98 as a sensor unit and an outer edge portion 90, and the like, similarly to the above-described physical quantity sensor 1. Since the first sensor element 98 is the same as that in the above-described physical quantity sensor 1, description thereof will not be repeated.

The physical quantity sensor 1c of Modification Example 3 is provided with the outer edge portion 90 in which the planar shape forms a rectangular shape, and is provided with a third groove portion 91 on the outer edge portion 90 in addition to the first and second groove portions 92 and 93 similar to the physical quantity sensor 1a of the above-described Modification Example 1.

The third groove portion 91 extends in a direction orthogonal to the two diagonal lines CL1 and CL2 that pass through the four corners of the outer edge portion 90 when the physical quantity sensor 1c is seen in plan view. It is possible for the diagonal lines CL1 and CL2 to be referred to as the center lines passing through the center G of the physical quantity sensor 1c. The third groove portions 91 are present in the four corners of the outer edge portion 90 and arranged in a substantially symmetrical shape with respect to the diagonal lines CL1 and CL2.

The third groove portion 91 is a slot (groove) that penetrates from the upper surface to the lower surface of the outer edge portion 90, similarly to the first and second groove portions 92 and 93. The length or width in the extension direction of the third groove portion 91 is provided to a similar extent as the first and second groove portions 92 and 93. The third groove portion 91 may be a third groove group 91' (not shown) formed of a plurality of dot-like grooves 9.

The third groove portion 91 has an equivalent effect if provided in a range of approximately ±(plus or minus) 10 degrees with the above-described diagonal lines CL1 and CL2 as the center.

The first, second and third groove portions 92, 93 and 91 are arranged so that the shape configured by the first, second and third groove portions 92, 93 and 91 is two-fold rotationally symmetrical when the physical quantity sensor 1c is seen in plan view.

The third groove portion 91 may form an arc shape such as using a portion that overlaps concentric circles with the center G of the physical quantity sensor 1c as a reference.

According to the physical quantity sensor 1c according to Modification Example 3, the third groove portion 91 that extends in the direction orthogonal to the two diagonal lines CL1 and CL2 passing through the four corners of the outer edge portion 90 is provided on the outer edge portion 90 of the first sensor element 98 in addition to the first groove portion 92 extending in the first direction and the second groove portion 93 extending in the second direction that intersects the first direction. Accordingly, similarly to Modification Example 1, transmission of the stress that acts in a direction that intersects the extension direction of the grooves to the grooves is alleviated by the first and second groove portions 92 and 93.

In addition thereto, thermal distortion or the like from the first and second direction is concentrated through the third groove portions 91 provided in the four corners of the outer edge portion 90, and it is possible to effectively alleviate or suppress distortion stress in the corner portions (four corner parts) in which a comparatively large distortion stress arises. Because the corner portion of the outer edge portion 90 in which the diagonal lines CL1 and CL2 are provided is a large distance from the center of the first sensor element 98, the distortion (warping) due to thermal expansion or the like increases. Distortion (stress) is imparted from both of the first direction (X-axis direction) and the second direction (Y-axis direction) to the corner portions (four corners) of the outer edge portion 90. In contrast, because the third groove portion 91 is provided in a direction orthogonal to the diagonal line, it is possible to efficiently alleviate and suppress while dispersing distortion (stress) imparted from the first direction (X-axis direction) and second direction (Y-axis direction).

In so doing, it is possible to provide a physical quantity sensor 1c with more stable electrical characteristics in which fluctuations in the electrical characteristics due to leakage vibration or leakage force such as a disturbance transferred from the outside to the first sensor element 98 while having a shield effect of blocking or reducing the leaking of signals that the first sensor element 98 detects or noise imparted on the first sensor element 98 from the outside.

Modification Example 4

The physical quantity sensor 1d shown in FIG. 3A is provided with a first sensor element (first functional element) 98 as a sensor unit and an outer edge portion 90, and the like, similarly to the above-described physical quantity sensor 1. Since the first sensor element 98 is the same as that in the above-described physical quantity sensor 1, description thereof will not be repeated.

The physical quantity sensor 1d of Modification Example 4 is provided with the first and second groove portions 92 and 93 similarly to Modification Example 1 arranged on the outer edge portion 90 in the length direction when the physical quantity sensor 1d is seen in plan view. Similarly, the third groove portions 91, 91a and 91b that extend in a direction orthogonal to the center lines CL1 to CL5 that pass through the center of the first sensor element are provided on the outer edge portion 90 facing the short side direction. Here, the groove portion that extends in the direction orthogonal to the two center lines (diagonal lines) CL1 and CL2 that pass through the four corners of the outer edge portion 90 are the third groove portions 91 described in Modification Example 3. The second groove portion 93 is provided on the center line CL4 along the direction (X-axis direction) orthogonal to the extension direction of the outer edge portion 90.

The third groove portions 91, 91a, and 91b are slots (groove) that penetrate from the upper surface to the lower surface of the outer edge portion 90, similarly to the first and second groove portions 92 and 93. The length or width in the extension direction of the third groove portions 91, 91a, and 91b is provided to a similar extent as the first and second groove portions 92 and 93.

The third groove portions 91, 91a and 91b have an equivalent effect if provided in a range of approximately ±(plus or minus) 10 degrees with the center lines (diagonal lines) CL1 and CL2 as the center.

The first groove portion 92, the second groove portion 93, and the third groove portions 91, 91a, and 91b are arranged so that the shape configured by the first groove portion 92, the second groove portion 93, and the third groove portions 91, 91a, and 91b is two-fold rotationally symmetrical when the physical quantity sensor 1d is seen in plan view.

The third groove portions 91, 91a, and 91b may form an arc shape such as using a portion that overlaps concentric circles with the center G of the physical quantity sensor 1d as a reference.

According to the physical quantity sensor 1d according to Modification Example 4, the third groove portions 91, 91a, and 91b that extend in a direction orthogonal to the two center lines (diagonal lines CL1 and CL2) passing through the four corners of the outer edge portion 90 and the center lines CL3 and CL5 is provided on the outer edge portion 90 of the first sensor element 98, in addition to the first groove portion 92 extending in the first direction and the second groove portion 93 extending in the second direction that intersects the first direction. Accordingly, similarly to Modification Example 1, transmission of the stress that acts in a direction that intersects the extension direction of the grooves to the grooves is alleviated by the first and second groove portions 92 and 93.

In addition thereto, thermal distortion or the like from the first and second direction is concentrated through the third groove portions 91 provided in the four corners of the outer edge portion 90 and the other third groove portions 91a and 91b, and it is possible to effectively alleviate or suppress distortion stress in the corner portions (four corner parts) in which a comparatively large distortion stress arises. In so doing, it is possible to provide a physical quantity sensor 1d with more stable electrical characteristics in which fluctuations in the electrical characteristics due to leakage vibration or leakage force such as a disturbance transferred from the outside to the first sensor element 98 while having a shield effect of blocking or reducing the leaking of signals that the first sensor element 98 detects or noise imparted on the first sensor element 98 from the outside.

Modification Example 5

The physical quantity sensor 1e shown in FIG. 3B is provided with a first sensor element (first functional element) 98 as a sensor unit and an outer edge portion 90, and the like, similarly to the above-described physical quantity sensor 1. Since the first sensor element 98 is the same as that in the above-described physical quantity sensor 1, description thereof will not be repeated.

The physical quantity sensor 1e of Modification Example 5 is provided with the first groove group 92' arranged on the outer edge portion 90 in the long side direction and the second groove group 93' arranged on the outer edge portion 90 in the short side direction when the physical quantity sensor 1e is seen in plan view. The first groove group 92' in the embodiment is configured with the dot-like grooves 9 arranged lined up in the X-axis direction as a first direction. The second groove group 93' is configured with the dot-like grooves 9 arranged lined up in the Y-axis direction as a second direction that intersects the first direction (X-axis direction). The first direction in which the first groove group 92' extends is the displacement direction of the movable portion (movable electrode 50: refer to FIGS. 1A to 1C).

The number of the dot-like grooves 9 and the size and number of first and second groove groups 92' and 93' are not limited to the above-described content. For example, the number of dot-like grooves 9 may be reduced to shorten the length of the first and second groove groups 92' and 93' or the diameter of the dot-like grooves 9 may be reduced to narrow the width of the first and second groove groups 92' and 93' to arrange greater numbers. For example, the rows of the dot-like grooves 9 may be a plurality of rows or the gap between the dot-like groove 9 and the neighboring dot-like groove 9 may be random. However, it is necessary that the groove portions be provided in a range not impeding the effect as a shield electrode.

The physical quantity sensor 1e according to Modification Example 5 includes the first groove group 92' in which the dot-like grooves 9 are arranged lined up in the first direction (+X direction) on the long edge side of the outer edge portion 90 of the first sensor element 98 and the second groove group 93' in which the dot-like grooves 9 are arranged lined up in the second direction that intersects the first direction on the short edge side of the outer edge portion 90 are included. By providing the first and second groove groups 92' and 93' of such a configuration, the transmission of the stress that acts in a direction that intersects the arrangement direction of the dot-like grooves 9 with respect to the arrangement direction (extension direction of the first and second groove groups 92' and 93') of the dot-like grooves 9 is alleviated by the first and second groove groups 92' and 93', similarly to Modification Example 1. Accordingly, it is possible to obtain an physical quantity sensor 1e with more stable electrical characteristics in which fluctuations in the electrical characteristics due to leakage vibration or leakage force such as a disturbance transferred from the outside to the first sensor element 98 while having a shield effect of blocking or reducing the leaking of signals that the first sensor element 98 detects or noise imparted on the first sensor element 98 from the outside.

Although the configuration of the first groove portion 92 (or first groove group 92'), the second groove portion 93 (or second groove group 93') and the third groove portion 91 (or third groove group 91') of the above-described modification example is described distinguished from the configuration in which one groove extends and a configuration in which the dot-like grooves 9 are arranged lined up, there is no limitation thereto. The configuration of the groove portions configured by the first groove portion 92 (or first groove group 92'), the second groove portion 93 (or second groove group 93') and the third groove portion 91 (or third groove group 91') may be provided with a mix of a configuration in which one groove extends and a configuration in which the dot-like grooves 9 are arranged lined up.

Modification Example of Groove Shape

The planar shape of the dot-like grooves 9 described above is not limited to circular shape and may be another shape. The planar shape of the dot-like grooves 9, as shown in FIG. 3C, may be a polygon, such as dot-like grooves 9a that form a square shape, dot-like grooves 9b that form a triangular shape, dot-like grooves 9c that form a rectangular (quadrilateral) shape, and dot-like grooves 9d that form a hexagonal shape, or a shape having a curved line portion such as an ellipse, in addition to dot-like grooves 9 that form a circular shape. A combination of planar shapes of the dot-like grooves or elongated hole grooves may be used in the configuration of the first groove portion 92 (or first groove group 92').

Embodiment 2

Figure 4A:
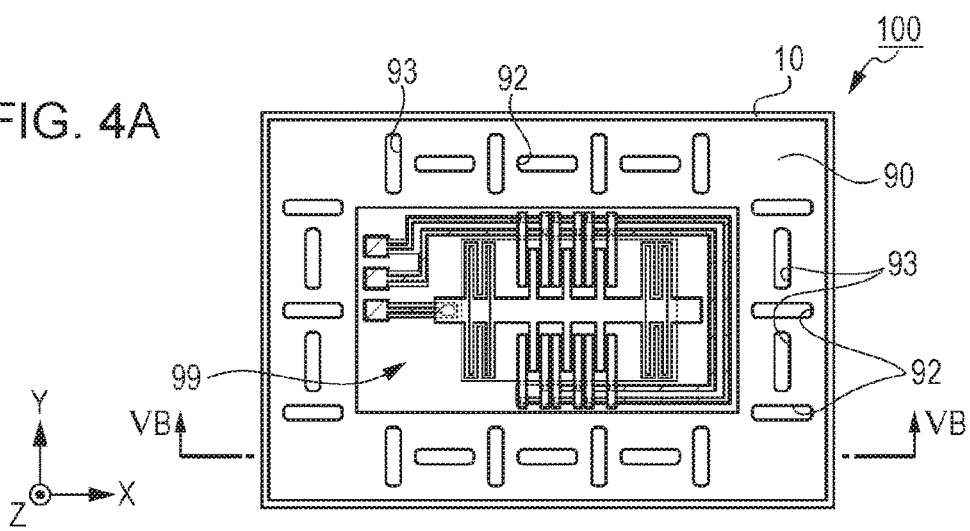
FIGS. 4A to 4C are schematic views showing a physical quantity sensor according to Embodiment 2 of an electronic device.
Figure 4B:
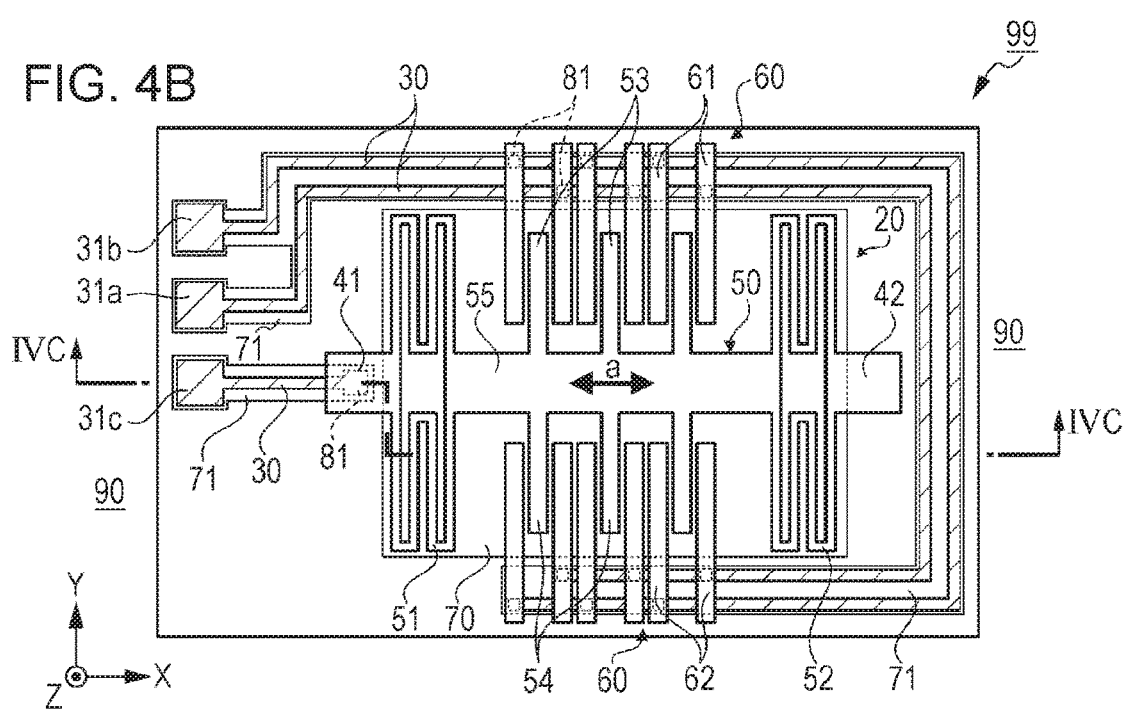
Figure 4C:
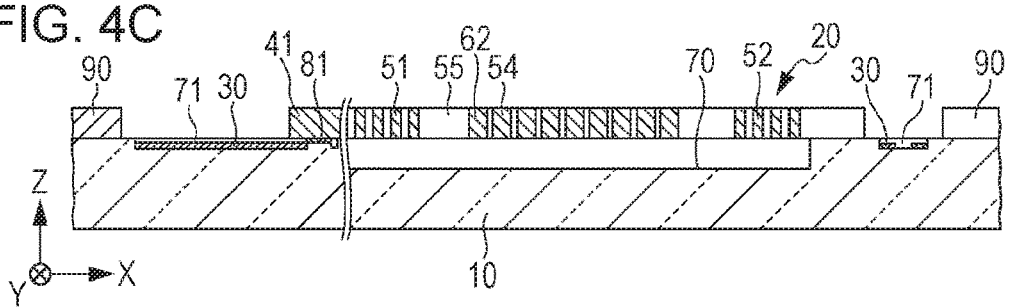

First, the physical quantity sensor according to Embodiment 2 of the electronic device will be described. FIGS. 4A to 4C are schematic views showing the physical quantity sensor according Embodiment 2 of the electronic device, in which FIG. 4A is a plan view, FIG. 4B is a plan view of the sensor element with which the physical quantity sensor is provided, and FIG. 4C is a cross-sectional view taken along IVC-IVC in FIG. 4B. Below, for convenience of description, on the XYZ axes denoted in the drawings, the X direction is the right direction, the X-axis direction (±X direction) is the horizontal direction, the Y direction is the inward direction, the Y-axis direction (±Y direction) is the front/rear direction, the Z direction is the upward direction, and the Z-axis direction (±Z direction) is the vertical direction or the thickness direction of the substrate 10, described later.

Configuration of Physical Quantity Sensor

The physical quantity sensor 100 is provided with a substrate 10, a first sensor element (first functional element) 99 as a sensor unit and an outer edge portion 90, and the like. The substrate 10 is a plate like body that supports the physical quantity sensor 100 as a base substrate, and has a rectangular shape when seen in plan view. The first sensor element 99 is provided on the main surface of the substrate 10. The substrate 10 also serves as a base substrate of the first sensor element 99. The first sensor element 99 is provided with a sensing unit 20, a wiring 30 and the like. The sensing unit 20 is provided with fixed portions 41 and 42, a movable electrode 50 as a movable portion, a fixed electrode 60 and the like. The movable electrode 50 is provided with support portions 51 and 52, movable electrode fingers 53 and 54, a movable base portion 55, and the like. Although the first sensor element (first functional element) 99 that configures the sensor unit and the outer edge portion 90 may be separately formed, it is preferable that they are formed from the same material. The configuration in which the first sensor element (first functional element) 99 and the outer edge portion 90 are formed with the same material can easily form the sensor unit, compared to a configuration in which the first sensor element (first functional element) 99 and the outer edge portion 90 are separately formed.

The substrate 10 is provided with a recessed portion 70 on the upper surface thereof as the main surface. The recessed portion 70 is formed in a region within which the movable electrode 50 (support portions 51 and 52, movable electrode fingers 53 and 54, and movable base portion 55) of the sensing unit 20 falls when the substrate 10 is seen in plan view.

The fixed portions 41 and 42 are provided bonded to the main surface of the substrate 10 in a region outside the region of the recessed portion 70 when the substrate 10 is seen in plan view. Specifically, the fixed portion 41 is bonded to the part on the −X direction side (left side in the drawings) with respect to the recessed portion 70 on the main surface of the substrate 10, and the fixed portion 42 is bonded to the part on the +X direction side (right side in the drawings) with respect to the recessed portion 70. The fixed portions 41 and 42 are each provided so as to straddle the outer peripheral edge portion of the recessed portion 70 when seen in plan view.

The movable base portion 55 is a rectangular plate like body in which the length direction faces the X direction, and is supported while isolated from the substrate 10 via the support portions 51 and 52 between the fixed portions 41 and 42. More specifically, the end portion of the movable base portion 55 on the left side in the drawing is connected to the fixed portion 41 via the support portion 51, and the end portion of the movable base portion 55 on the right side in the drawing is connected to the fixed portion 42 via the support portion 52.

A plurality (in the embodiment, three) of beam-like movable electrode fingers 53 extend in the +Y direction from the long side part on the +Y side of the movable base portion 55 and a plurality (in the embodiment, three) of beam-like movable electrode fingers 54 extends in the −Y direction from the long edge part on the −Y side of the movable base portion 55.

The recessed portion 70 is formed as an escape portion for causing the movable electrode 50 (support portions 51 and 52, movable electrode fingers 53 and 54, and movable base portion 55) to be isolated from the substrate 10. In the embodiment, although the shape in plan view of the recessed portion 70 is a rectangle, there is no limitation thereto.

The support portions 51 and 52 are connected to the movable base portion 55 to be displaceable with respect to the fixed portions 41 and 42. In the embodiment, as shown by the arrow a in FIG. 4B, the support portions 51 and 52 are configured so that the movable base portion 55 is able to displace in the X-axis direction.

The plurality of movable electrode fingers 53 and the plurality of movable electrode fingers 54 that extend in the Y-axis direction are provided lined up in the X-axis direction in which the movable electrode 50 displaces.

The support portion 51 is, specifically, configured by two (a pair) of beams, and each forms a shape that extends in the +X direction while meandering in the Y-axis direction. In other words, each of the beams is formed folded back a plurality (in the embodiment, three times) of times in the Y-axis direction. The number of times each beam is folded back may be one or two times, or may be four or more times.

The support portion 52 is also similarly formed by a pair of beams that form a shape extending in the −X direction while meandering in the Y-axis direction.

The fixed electrode 60 is provided with a plurality of fixed electrode fingers 61 and 62 lined up so as to form a pectinate shape that mesh while spaced with a gap with the plurality of movable electrode fingers 53 and 54 of the movable electrode 50.

The fixed electrode fingers 61 are arranged a pair at a time facing both sides of the in the X-axis direction so as to interpose one of the movable electrode fingers 53 spaced by a gap. In other words, a pair of fixed electrode fingers 61, that is, two fixed electrode fingers 61, is arranged at three locations. Similarly, the fixed electrode fingers 62 are arranged a pair at a time facing both sides of the in the X-axis direction so as to interpose one of the movable electrode fingers 54 spaced by a gap. In other words, a pair of fixed electrode fingers 62, that is, two fixed electrode fingers 62, is arranged at three locations.

The fixed electrode fingers 61 and 62 are each provided with one end portion bonded to the main surface in a region outside the region of the recessed portion 70 on the main surface of the substrate 10 when the substrate 10 is seen in plan view. Specifically, each end portion of the fixed electrode finger 61 on the opposite side (+Y side with respect to the movable electrode 50) to the movable electrode 50 side is bonded to the upper surface of the substrate 10 on the +Y direction side with respect to recessed portion 70. Each fixed electrode finger 61 includes an end on the fixed side thereof as the fixed side, and a free side that extends in the −Y direction. Similarly, each the end portion of the fixed electrode finger 62 on the opposite side (−Y side with respect to the movable electrode 50) to the movable electrode 50 side is bonded to the upper surface of the substrate 10 on the −Y direction side with respect to recessed portion 70, and the end on the fixed side thereof is the fixed end and the free end extends in the +Y direction.

Through such a configuration, it is possible for the capacitance between the fixed electrode finger 61 positioned on the +X side of the movable electrode finger 53 between the fixed electrode fingers 61 (below, referred to as the first fixed electrode finger) and the movable electrode finger 53 and the capacitance between the fixed electrode finger 61 positioned on the −X side of the movable electrode finger 53 between the fixed electrode fingers 61 (below, referred to as the second fixed electrode finger) and the movable electrode finger 53 to be changed according to displacement of the movable electrode 50.

Similarly, it is possible for the capacitance between the fixed electrode finger 62 positioned on the +X side of the movable electrode finger 54 between the fixed electrode fingers 62 (below, similarly referred to as the first fixed electrode finger) and the movable electrode finger 54 and the capacitance between the fixed electrode finger 62 positioned on the −X side of the movable electrode finger 54 between the fixed electrode fingers 62 (below, similarly referred to as the second fixed electrode finger) and the movable electrode finger 54 to be changed according to displacement of the movable electrode 50.

The first fixed electrode finger and the second fixed electrode finger are isolated from one another on the substrate 10 and electrically insulated. Therefore, it is possible to separately measure the capacitance between the first fixed electrode finger and the movable electrode 50 (movable electrode fingers 53 and 54) and the capacitance between the second fixed electrode finger and the movable electrode 50 (movable electrode fingers 53 and 54) and to highly precisely detect physical quantities based on the measurement results thereof.

That is, the sensing unit 20, for example, is displaced in the X-axis direction (+X direction or −X direction) while the movable electrode 50 (movable electrode fingers 53, 54) causes the support portions 51 and 52 to be elastically deformed according to changes in physical quantities such as acceleration and angular velocity. The first sensor element 99 is able to detect physical quantities, such as acceleration or angular velocity, based on the capacitance that changes according to such displacement. That is, the first sensor element 99 is a capacitive acceleration sensor.

The shape of the movable electrode 50 and the fixed electrode 60 is determined according to the size and shape of each portion that configures the sensing unit 20, and is not limited to the above-described configuration.

The wiring 30 is an electrical connection wiring for detecting the capacitance, and is laid along the concavity 71 formed on the main surface of the substrate 10. The wiring 30 includes each of a wiring that connects to the electrode 31a for connecting to an external circuit electrically connected to the first fixed electrode finger, a wiring that connects to the electrode 31b for connecting to an external circuit electrically connected to the second fixed electrode finger, and a wiring that connects to the electrode 31c for connecting the movable electrode 50 and an external circuit.

The concavity 71 is provided as a region in which the wiring 30 is laid in the region outside the recessed portion 70. That is, the concavity 71 is formed so that the region in which the wiring 30 is laid falls within the concavity 71 when the substrate 10 is seen in plan view.

The depth dimension of the concavity 71 (dimension in the thickness direction of the substrate 10) is larger than the thickness dimension of the wiring 30, excluding the contact portion, described later, and smaller than the depth dimension of the recessed portion 70.

As described above, by using a configuration in which the concavity 71 is formed on the main surface of the substrate 10, and a wiring 30 thinner than the depth of the concavity 71 is laid within the region of the concavity 71, contact between the wiring 30 in the region other than the predetermined electrical connection portion and the sensing unit 20 layered on the upper layer of the substrate 10 is avoided.

The predetermined electrical connection portion is a contact portion at which the wiring 30 with the upper layer that configures the sensing unit 20 layered so as to cover a portion of the wiring 30 and the upper layer thereof abut and are electrically connected.

As shown in FIG. 4B, the first and second fixed electrode fingers are electrically connected by the wiring 30 and the wiring 30 and fixed portion 41 are connected by the contact portion 81. The movable electrode 50 is electrically connected to the wiring 30 via the fixed portion 41. Since the constituent material of the wiring 30 is the same as the above-described Embodiment 1, description thereof will not be repeated.

Other than on the contact portion at which the wiring 30 and the upper layer that configures the sensing unit 20, an insulating film may be provided on the wiring 30. The insulating film includes a function of avoiding electrical connection (short circuiting) of the wiring 30 and the non-contact portion of the sensing unit 20. Although the constituent material of the insulating film is not particularly limited, and it is possible to use various materials having insulating properties, it is preferable to use silicon dioxide ($SiO_2$) in a case where the substrate 10 is configured by a glass material (in particular, a glass material to which alkaline metal ions are added).

The outer edge portion 90 includes a function as a shield electrode having an effect of blocking or reducing leakage of signals that the first sensor element 99 detects or noise imparted from the outside to the first sensor element 99. The outer edge portion 90, as shown in FIG. 4A, is arranged on the outer peripheral region of the first sensor element 99 on the main surface of the substrate 10, when the substrate 10 is seen in plan view.

Specifically, in the center portion on the main surface of the substrate 10, the first sensor element 99 is configured occupying a rectangular region in plan view. The outer edge portion 90 is formed in a frame shape so as to surround the first sensor element 99 in the center portion on the main surface of the substrate 10. A fixed potential, such as a ground potential, is provided to the outer edge portion 90 through the wiring (not shown). The outer edge portion 90 has an effect as a shield electrode by setting the outer edge portion 90 to a fixed potential, such as a ground potential.

The outer edge portion 90 includes a plurality of first groove portions 92 that extend in the X-axis direction as the first direction and a plurality of second groove portions 93 that extend in the Y-axis direction as the second direction that intersects the first direction (X-axis direction) when the substrate 10 is seen in plan view. That is, the first direction in which the first groove portion 92 extends is the displacement direction of the movable portion (movable electrode 50).

The first groove portion 92 is a slot (groove) that penetrates from the upper surface to the lower surface of the outer edge portion 90, and the length in the X-axis direction is approximately 70% of the frame width of the outer edge portion 90 that forms a frame shape, and the width in the Y-axis direction is approximately 10% of the frame width of the outer edge portion 90. The first groove portions 92 are arranged at substantially equal intervals in the frame region of the outer edge portion 90.

The second groove portion 93 is a slot (groove) that penetrates the outer edge portion 90, similarly to the first groove portion 92, and the length in the Y-axis direction is approximately 70% of the frame width of the outer edge portion 90 that forms a frame shape, and the width in the X-axis direction is approximately 10% of the frame width of the outer edge portion 90. The second groove portion 93 is arranged at substantially equal intervals lined up between or so as to alternately neighbor the first groove portions 92 arranged at substantially equal intervals.

The first groove portion 92 and the second groove portion 93 are arranged so that the shape configured by the first groove portion 92 and the second groove portion 93 is two-fold rotationally symmetrical when the substrate 10 is seen in plan view.

The size and number of first groove portions 92 and the second groove portions 93 is not limited to the above-described content. A configuration may be used in which the length and width are further reduced, to arrange greater numbers. The first and second groove portions 92 and 93 are connected, and may be configured in a cross shape, a T-shape, or an L-shape. However, it is necessary that the groove portions be provided in a range not impeding the effect as a shield electrode. It is preferable to arrange the shapes configured by the first and second groove portions 92 and 93 to be rotationally symmetrical.

Silicon is used as a suitable example of the material that configures the sensing unit 20 (fixed portions 41 and 42, support portions 51 and 52, movable electrode fingers 53 and 54, movable base portion 55, and fixed electrode fingers 61 and 62) and the outer edge portion 90. In the manufacturing thereof, it is preferable to form these portions by integrally patterning one silicon substrate.

It is possible for the silicon substrate to be highly precisely worked by etching. Therefore, it is possible to have superior dimensional precision in the sensing unit 20 and the like, and as a result to achieve increased sensitivity in the first sensor element 99 by configuring the sensing unit 20 from a silicon substrate as a main material.

It is preferable for the silicon material that configures the sensing unit 20 and the outer edge portion 90 to be doped with impurities such as phosphorous and boron. In so doing, it is possible for the first sensor element 99 to have excellent conductivity of the sensing unit 20 and shielding properties as the shield electrode of the outer edge portion 90.

The constituent material of the sensing unit 20 is not limited to a silicon substrate, and may be a material able to detect physical quantities based on variations in the capacitance.

A glass material having insulating properties is used as a suitable example of the constituent material of the substrate 10. In particular, in a case where the sensing unit 20 is configured by a silicon substrate, it is preferable to use a glass material (for example, a borosilicate glass, such as Pyrex (registered trademark) glass) that includes alkaline metal ions (movable ions). In so doing, it is possible to configure the first sensor element 99 by anode bonding the substrate 10 (glass substrate) and the sensing unit 20 (silicon substrate).

Figure 5A:
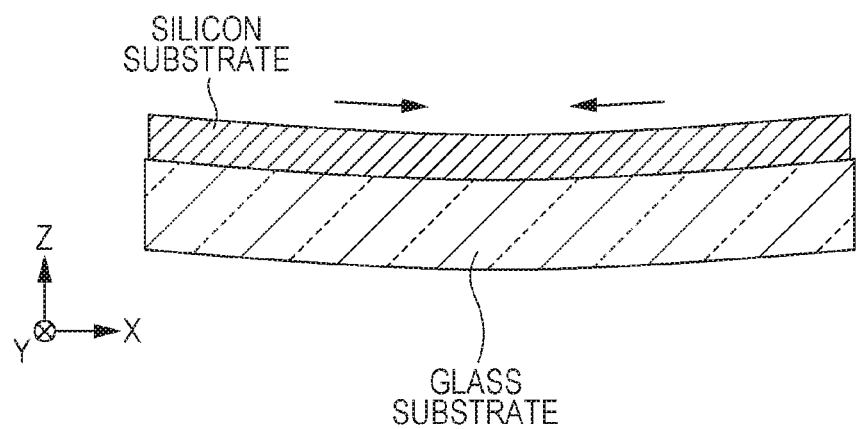
FIG. 5A is a schematic view showing a state in which a substrate and a silicon substrate are adhered together in a physical quantity sensor according to Embodiment 2.

FIG. 5A is a schematic view showing a state when the glass substrate and the silicon substrate that configured the outer edge portion or the sensing unit are adhered together.

As described above, in a physical quantity sensor having a layered structure in which a layer (such as a silicon substrate) that configures the sensing unit or outer edge portion (shield electrode) is adhered to the substrate (such as a glass substrate), there is a problem in that the detection characteristics as a sensor fluctuate due to the temperature and environment in which the sensor is used. Specifically, as shown in FIG. 5A, through thermal stress that occurs due to differences in the coefficient of thermal expansion between the glass substrate and the silicon substrate layered on the glass substrate causing the glass substrate to warp or the like, a problem arises of the detection characteristics fluctuating because the sensor element is deformed or influence being imparted on the displacement of the movable portion (movable electrode) of the sensor element.

In contrast, by providing the first and second groove portions 92 and 93 on the outer edge portion 90 (silicon substrate) as in the embodiment. It is possible to alleviate the thermal stress.

Figure 5B:
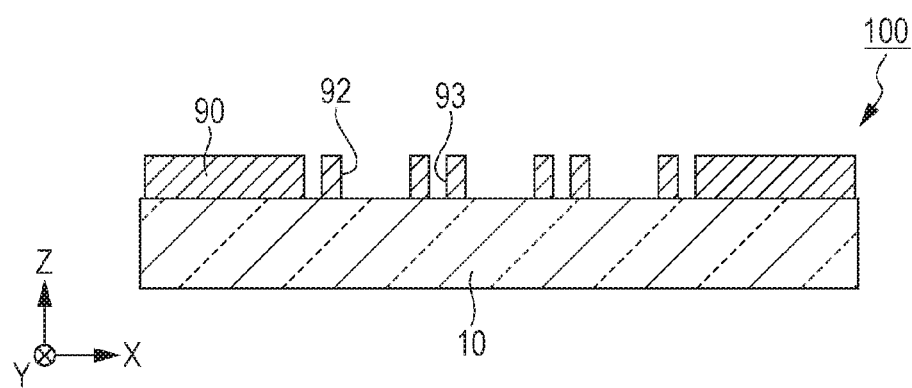
FIG. 5B is a cross-sectional view taken along line VB-VB is FIG. 4A.

FIG. 5B is a cross-sectional view taken along line VB-VB in FIG. 4A, and shows a state in which the first and second groove portions 92 and 93 are provided on the outer edge portion 90. As is apparent from the drawings, by the first groove portion 92 or the second groove portion 93 penetrating the outer edge portion 90, alleviation of the thermal stress that occurs itself or suppression of the transmission of the occurring thermal stress is possible. That is, the occurring thermal stress is alleviated (reduced) by reducing the boding area between the substrate 10 and the outer edge portion 90, and the transmission of the thermal stress is interrupted by the outer edge portion 90 being discontiguous. As a result, the occurrence of warping as shown in FIG. 5A is suppressed.

Manufacturing Method of Physical Quantity Sensor

Next, the method of manufacturing the physical quantity sensor 100 according to Embodiment 2 of the electronic device will be described. FIGS. 6A to 6D are front cross-sectional views schematically showing a method of manufacturing the physical quantity sensor 100 according to Embodiment 2 of the electronic device.

Figure 6A:
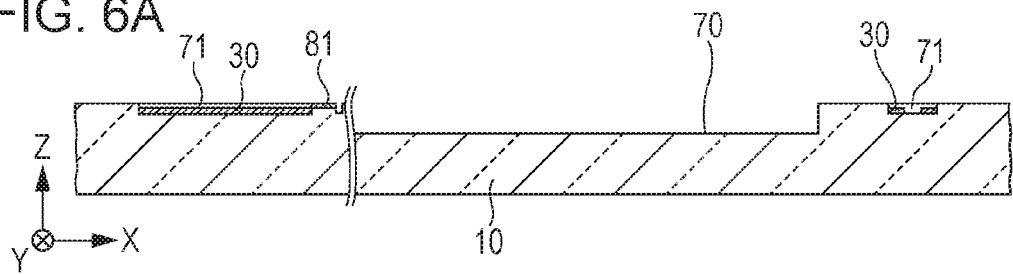
FIGS. 6A to 6D are front cross-sectional views schematically showing a method of manufacturing the physical quantity sensor according to Embodiment 2.

As shown in FIG. 6A, the recessed portion 70 and the concavity 71 are formed in the surface of the substrate 10. The material of the substrate 10 is an insulator, and, for example, is glass. Formation of the recessed portion 70 and the concavity 71 is performed using a photolithography method, and a chromium (Cr) layer and gold (Au) layer, not shown, are formed by etching as master patterns. In so doing, the recessed portion 70 and the concavity 71 are formed cut into the upper surface. The etching work is performed by wet etching using a solution including hydrofluoric acid or by dry etching with plasma.

The conductor that configures the wiring 30 or the contact portion 81 is formed on the bottom surface of the concavity 71 and is patterned. The conductive material that forms the conductor is not particularly limited and it is possible to use a metal material such as gold (Au), platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), cobalt (Co), zinc (Zn), and zirconium (Zr) or an electrode material such as ITO or ZnO.

Figure 6B:
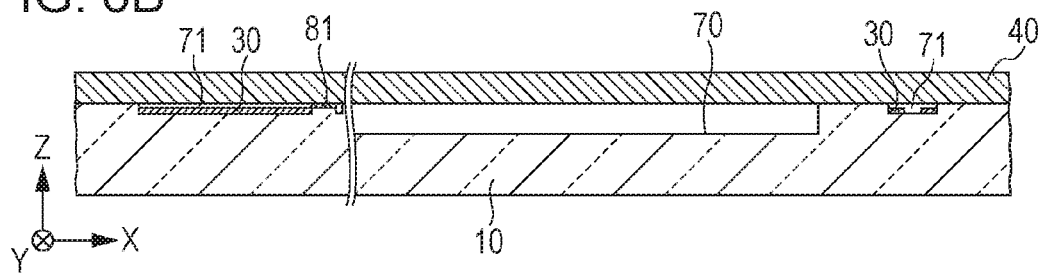

Next, as shown in FIG. 6B, the functional element substrate 40 that configures the sensor unit is adhered to the substrate 10. The functional element substrate 40 is a silicon substrate, and adhering with the substrate 10 is performed by anode bonding. The functional element substrate 40 is adhered to the planar parts excepting the recessed portion 70 and the concavity 71 of the substrate 10.

Figure 6C:
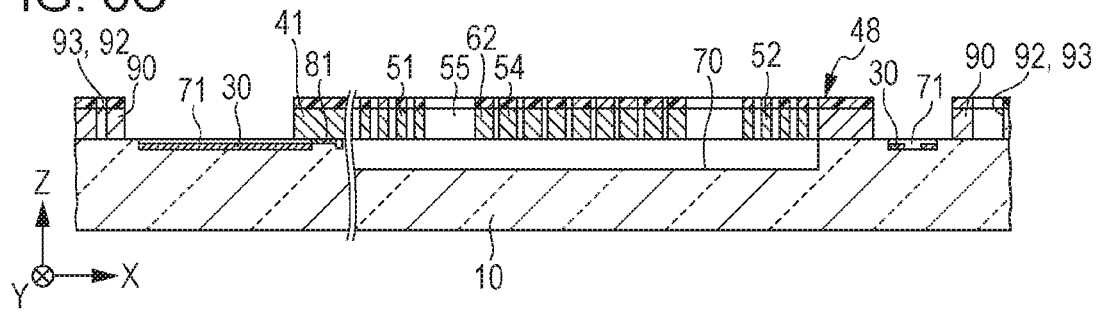

Next, as shown in FIG. 6C, the sensor portion is formed by etching the functional element substrate 40 using a photolithography method. The etching work uses dry etching or wet etching, and the resist layer 48 is patterned at a predetermined position, then the exposed parts of the functional element substrate 40 are etched, thereby forming the fixed portion 41, the support portion 51, the movable electrode finger 54 inside the fixed electrode finger 62, the movable base portion 55, the outer edge portion 90 and the like. In the outer edge portion 90, the first groove portions 92 that extend in the first direction (X-axis direction) and the second groove portions 93 that extend in the second direction (Y-axis direction) that intersects the first direction are included together penetrating the outer edge portion 90. In this step, it is also possible to form the third groove portion 91.

Figure 6D:
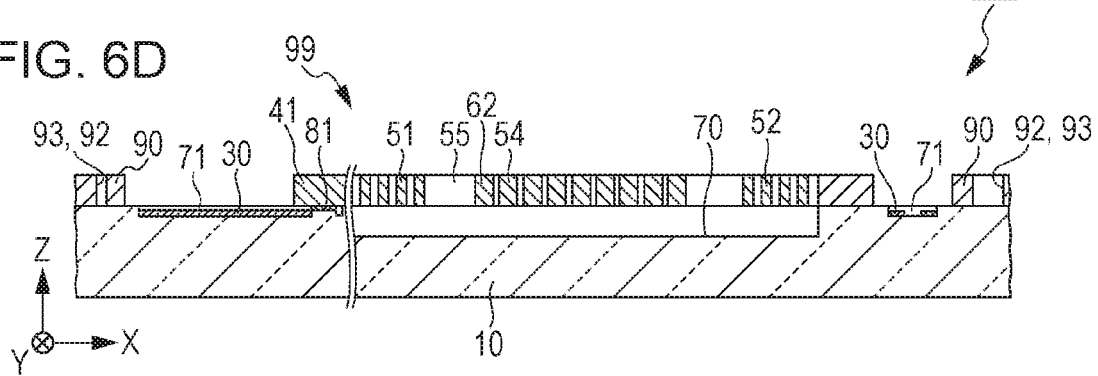

Through a step such as above, as shown in FIG. 6D, it is possible to form a physical quantity sensor 100 provided with a substrate 10 and a first sensor element (first functional element) 99 as a sensor unit formed from functional element substrate 40 adhered to the substrate 10.

According to the method of manufacturing the above-described physical quantity sensor 100, the functional element substrate 40 is bonded facing the recessed portion 70 formed in the substrate 10, thereafter the functional element substrate 40 is patterned, and the first sensor element (first functional element) 99, the outer edge portion 90, and the first and second groove portions 92 and 93 of the outer edge portion 90 are formed. In this way, it is possible to form, from the functional element substrate 40 bonded to the substrate 10, the first sensor element (first functional element) 99, the outer edge portion 90, and the first groove portion 92 and the second groove portion 93 of the outer edge portion 90 in the same step. In other words, it is possible to easily form the first sensor element (first functional element) 99, the outer edge portion 90, and the first and second groove portions 92 and 93 of the outer edge portion 90.

As described above, according to the physical quantity sensor 100 according to the embodiment, it is possible to obtain the following effects.

The physical quantity sensor 100 is provided with a substrate 10, a first sensor element 99 provided on the main surface of the substrate 10, and an outer edge portion 90 arranged on the outer periphery of the first sensor element 99 (outer periphery when the substrate 10 is seen in plan view). The outer edge portion 90 includes the first groove portions 92 that extend in the first direction (X-axis direction) and the second groove portions 93 that extend in the second direction (Y-axis direction) that intersects the first direction. Therefore, the thermal stress generated in a case where the outer edge portion 90 has a different coefficient of thermal expansion to the coefficient of thermal expansion of the substrate 10 is at least alleviated by any of the grooves.

Specifically, transmission of the stress that acts in a direction that intersects the extension direction of the grooves to the grooves is alleviated by the grooves. Accordingly, the thermal stress arising between the substrate 10 and the outer edge portion 90 on the main surface of the substrate 10 is also alleviated by the grooves (first and second groove portions 92 and 93, or at least one of the grooves). For example, in a case where the substrate 10 is warped by the thermal stress, the warping is alleviated by the grooves. As a result, thermal stress generated due to differences in the coefficient of thermal expansion causing the first sensor element 99 to be deformed or exerting an influence on the displacement of the movable portion (movable electrode 50) that the first sensor element 99 is provided is suppressed, and fluctuations in the detection characteristics due to temperature changes in the environment in which the first sensor element 99 is used are suppressed.

Because it is possible to forms the outer edge portion 90 and the first and second groove portions 92 and 93 of the outer edge portion 90 with the same step, it is possible to easily form the first sensor element (first functional element) 99, the outer edge portion 90 and the first and second groove portions 92 and 93 of the outer edge portion 90.

That is, a physical quantity sensor with more stable detection characteristics in which fluctuations in the detection characteristics due to temperature changes in the environment in which the sensor is used are suppressed can be provided.

The first direction is the displacement direction (displacement direction in plan view of the substrate 10) of the movable portion provided in the first sensor element 99. That is, the outer edge portion 90 arranged on the outer periphery of the first sensor element 99 is provided with the first groove portion 92 that extends in the same direction as the direction in which the movable portion provided in the first sensor element 99 displaces and the second groove portion 93 that extends in a direction that intersects the direction in which the movable portion provided in the first sensor element 99 displaces when the substrate 10 is seen in plan view.

In a case where the outer edge portion 90 has a different coefficient of thermal expansion to the coefficient of thermal expansion of the substrate 10, because the outer edge portion 90 is provided with the second groove portion 93 that extends in a direction intersecting the displacement direction of the movable portion provided in the first functional element 99, it is possible to more effectively alleviate the thermal stress arising in the displacement direction of the movable portion with the second groove portion 93. In particular, the thermal stress is more effectively alleviated in a case where the second groove portion 93 extends intersecting a direction at a right angle to the displacement direction of the movable portion.

The thermal stress itself that the substrate 10 receives from the outer edge portion 90 is suppressed by the outer edge portion 90 being provided with the first groove portion 92. By the outer edge portion 90 being provided with the first groove portion 92 that extends in the displacement direction of the movable portion provided in the first sensor element 99, the thermal stress itself occurring in the displacement direction of the movable portion that the substrate 10 receives from the outer edge portion 90 is suppressed.

As a result, thermal stress generated due to differences in the coefficient of thermal expansion causing the first sensor element 99 to be deformed or exerting an influence on the displacement of the movable portion (movable electrode 50) that the first sensor element 99 is provided is suppressed, and fluctuations in the detection characteristics due to temperature changes in the environment in which the first sensor element 99 is used are suppressed.

Modification Examples 6 to 13

Next, Modification Examples 6 to 15 of the physical quantity sensor according to Embodiment 2 will be described with reference to FIGS. 7 to 10. In the description, the same reference numerals will be used for the same constituent locations as the above-described Embodiment 2, and description thereof will not be repeated. In Modification Examples 6 to 15 below, for convenience of description, on the XYZ axes denoted in the FIGS. 7 to 10, the X direction is the right direction, the X-axis direction (±X direction) is the horizontal direction, the Y direction is the inward direction, the Y-axis direction (±Y direction) is the front/rear direction, the Z direction is the upward direction, and the Z-axis direction (±Z direction) is the vertical direction or the thickness direction of the substrate 10, described later.

Modification Example 6

First, the physical quantity sensor according to Modification Example 6 will be described using FIG. 7A. FIG. 7A is a plan view showing an outline of the physical quantity sensor 101 according to Modification Example 6.

The physical quantity sensor 101 of Modification Example 6 shown in FIG. 7A is provided with a second functional element (second sensor element 99a and third sensor element 99b), in addition to the first functional element (first sensor element 99) in the configuration of the sensor unit, and the first groove portion 92 is provided on the outer edge portion of the region between each sensor element.

The physical quantity sensor 101 is provided with the substrate 10, the first sensor element 99, the second sensor element 99a and the third sensor element 99b as the second functional element, the outer edge portion 90a and the like.

The second sensor element 99a is a capacitive acceleration sensor with a difference arrangement direction (orientation) with the same configuration as the first sensor element 99. The second sensor element 99a is arranged in an orientation that detects the acceleration in the Y-axis direction, in contrast to the first sensor element 99 detecting the acceleration in the X-axis direction.

The third sensor element 99b is a gyro sensor that detects angular velocity. An oscillator is provided as a movable portion in the interior.

The first, second, and third sensor elements 99, 99a, and 99b are arranged spaced apart from each other on the main surface of the substrate 10 as shown in FIG. 7A. Specifically, the first sensor element 99 is arranged on the region (region on the +X, −Y side) on the lower right in the drawings of the rectangular substrate 10, the third sensor element 99b is arranged on the region (region on the +X, +Y side) on the inward direction in the drawings, and the second sensor element 99a is arranged on the region (region in the center in the Y-axis direction on the −X side) on the left side of the drawings of the first sensor element 99 and the third sensor element 99b.

The outer edge portion 90a is arranged on the outer periphery each of the sensor elements. In other words, the outer edge portion 90a is formed on the region outside the region occupied by each of the sensor elements on the main surface of the substrate 10. A ground potential is provided to the outer edge portion 90a through the wiring (not shown).

The first groove portion 92 is provided on the outer edge portion 90a on the region between each of the sensor elements. Specifically, a groove row 94 in which the first groove portions 92 are lined up in the X-axis direction is provided on the outer edge portion 90a on the region between the first sensor element 99 and the third sensor element 99b. A groove row 95 in which the first groove portions 92 are lined up in the Y-axis direction is provided on the outer edge portion 90a in the region between the first and second sensor elements 99 and 99a and between the third and second sensor elements 99b and 99a.

It is not necessary to provide both of the groove rows 94 and 95, and the groove rows may be provided in the region necessary for alleviation of the stress generated between the sensor elements.

As described above, according to the physical quantity sensor 101 according to Modification Example 6, it is possible to obtain the following effects.

The physical quantity sensor 101 is further provided with the second functional element (second and third sensor elements 99a and 99b), in addition to the first sensor element (first functional element 99) provided on the main surface of the substrate 10. In this way, in a case where a plurality of sensor elements is provided on a common substrate, there are cases where noise occurring in one sensor element influences another sensor element or the detection characteristics as a physical quantity sensor are worsened. The noise is not only due to electrical energy, but may also be due to mechanical energy such as stress or vibration. Specifically, the thermal stress or the residual stress that the sensor element structure generates may influence the detection characteristics of the neighboring sensor element while the vibration leakage of the movable portion is transmitted to the neighboring sensor element in a case or the like of including the movable portion.

In Modification Example 6, the first groove portion 92 is provided on the outer edge portion 90a in any of the regions between the first and second sensor elements 99 and 99a, between the first and third sensor elements 99 and 99b, and between the second and third sensor elements 99a and 99b. Accordingly, it is possible for transmission of the stress acting between each of the sensor elements or the energy such as leakage vibration transmitted from one to the other to be alleviated by the first groove portions 92 and the influence on the characteristics to be suppressed.

Modification Example 7

Next, the physical quantity sensor according to Modification Example 7 will be described using FIG. 7B. FIG. 7B is a plan view showing an outline of the physical quantity sensor 102 according to Modification Example 7.

The physical quantity sensor 102 of Modification Example 7 shown in FIG. 7B is further provided with a second functional element (second sensor element 99a and third sensor element 99b), in addition to the first functional element (first sensor element 99) similarly to Modification Example 6, and the first and second groove portions 92 and 93 are provided on the outer edge portion 90a between each sensor element.

Since the configuration and the arrangement of the first sensor element (first functional element 99), and the second functional element (second and third sensor elements 99a and 99b) is the same as Modification Example 6, description thereof will not be repeated.

The outer edge portion 90a is arranged on the outer periphery each of the sensor elements. In other words, the outer edge portion 90a is formed on the region outside the region occupied by each of the sensor elements on the main surface of the substrate 10. A ground potential is provided to the outer edge portion 90a through the wiring (not shown).

The first and second groove portions 92 and 93 are provided on the outer edge portion 90a on the region between each of the sensor elements. Specifically, the groove row 94 formed from a row in which the first and second groove portions 92 and 93 are alternately lined up in the X-axis direction is provided on the outer edge portion 90a on the region between the first sensor element 99 and the third sensor element 99b. A groove row 95 formed from a row in which the first and second groove portions 92 and 93 are alternately lined up in the Y-axis direction is provided on the outer edge portion 90a in the region between the first and second sensor elements 99 and 99a and between the third and second sensor elements 99b and 99a.

In each of the groove rows 94 and 95, the first groove portion 92 and the second groove portion 93 are arranged so that the shape configured by the first groove portion 92 and the second groove portion 93 is two-fold rotationally symmetrical when the substrate 10 is seen in plan view.

It is not necessary to provide both of the groove rows 94 and 95, and the groove rows may be provided in the region necessary for alleviation of the stress generated between the sensor elements.

As described above, according to the physical quantity sensor 102 according to the embodiment, it is possible to obtain the following effects.

The physical quantity sensor 102 is further provided with the second functional element (second and third sensor elements 99a and 99b), in addition to the first sensor element (first functional element 99) provided on the main surface of the substrate 10. In this way, in a case where a plurality of sensor elements is provided on a common substrate, there are cases where noise occurring in one sensor element influences another sensor element or the detection characteristics as a physical quantity sensor are worsened. The noise is not only due to electrical energy, but may also be due to mechanical energy such as stress or vibration. Specifically, the thermal stress or the residual stress that the sensor element structure generates may influence the detection characteristics of the neighboring sensor element while the vibration leakage of the movable portion is transmitted to the neighboring sensor element in a case or the like of including the movable portion.

According to the embodiment, the first and second groove portions 92 and 93 are provided on the outer edge portion 90a in any of the regions between the first and second sensor elements 99 and 99a, between the first and third sensor elements 99 and 99b, and between the second and third sensor elements 99a and 99b. Accordingly, it is possible for transmission of the stress acting between each of the sensor elements or the energy such as leakage vibration transmitted from one to the other to be alleviated by the first and second groove portions 92 and 93 and the influence on the characteristics to be suppressed.

Modification Example 8

Next, the physical quantity sensor according to Modification Example 8 will be described. FIG. 7C is a plan view showing an outline of the physical quantity sensor 103 according to Modification Example 8.

FIG. 7C is a plan view showing an outline of the physical quantity sensor 103 according to Modification Example 8. The physical quantity sensor 103 of Modification Example 8 shown in FIG. 7C is provided with the first and second functional elements similarly to Modification Example 7, and the first and second groove portions 92 and 93 are provided over the entire region (entire surface) of the outer edge portion 90a that surrounds the outer periphery of each of the sensor elements.

The physical quantity sensor 103 is the same as the physical quantity sensor 102 other than the features of differing positions and numbers of the first and second groove portions 92 and 93 provided on the outer edge portion 90a. In the physical quantity sensor 103, as shown in FIG. 7C, the first and second groove portions 92 and 93 are arranged so as to alternately line up in the X-axis direction and the Y-axis direction over the entire region of the outer edge portion 90a. The first groove portion 92 and the second groove portion 93 are arranged so that the shape configured by the first groove portion 92 and the second groove portion 93 is two-fold rotationally symmetrical when the substrate 10 is seen in plan view.

As described above, according to the physical quantity sensor 103 according to the modification example, it is possible to obtain the following effects.

The thermal stress generated in a case where the outer edge portion 90a has a different coefficient of thermal expansion to the coefficient of thermal expansion of the substrate 10 is alleviated by the grooves (first and second groove portions 92 and 93 or at least one of the grooves). The thermal stress arising between the substrate 10 and the outer edge portion 90a on the main surface of the substrate 10 is also alleviated by the grooves. As a result, thermal stress generated due to differences in the coefficient of thermal expansion causing the sensor element (first, second and third sensor elements 99, 99a, and 99b) provided on the main surface of the substrate 10 to be deformed or exerting an influence on the displacement of the movable portion provided in the sensor element is suppressed, and fluctuations in the detection characteristics due to temperature changes in the environment in which the first sensor element is used are suppressed.

Accordingly, it is possible for transmission of the stress acting between the plurality of sensor elements or the energy, such as leakage vibration, transmitted from one to the other to be alleviated by the first and second groove portions 92 and 93 or at least one of these grooves and the influence on the characteristics to be suppressed.

In this way, by arranging the first and second groove portions 92 and 93 so as to alternately line up in the X-axis direction and the Y-axis direction over the entire region of the outer edge portion 90a, it is possible to more effectively achieve stability of the detection characteristics.

Modification Example 9

Figure 8A:
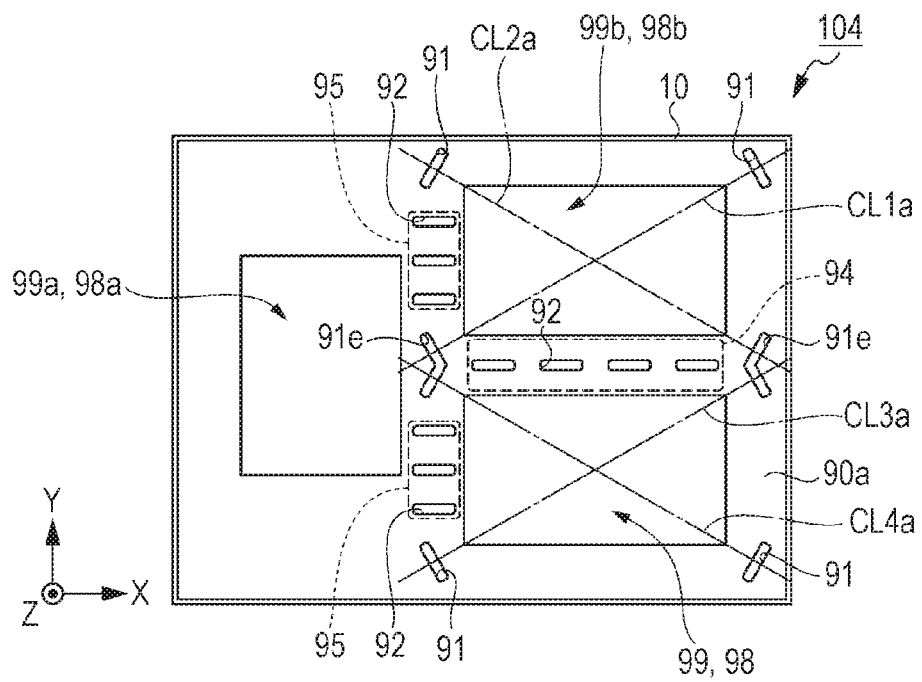
FIGS. 8A and 8B are plan views schematically showing Modification Examples 9 and 10 of the physical quantity sensor according to Embodiment 2 of the electronic device.

Next, the physical quantity sensor 104 according to Modification Example 9 will be described using FIG. 8A. FIG. 8A is a plan view showing an outline of the physical quantity sensor 104 according to Modification Example 9.

The physical quantity sensor 104 of Modification Example 9 shown in FIG. 8A is further provided with a second functional element (second sensor element 99a and third sensor element 99b), in addition to the first functional element (first sensor element 99) similarly to Modification Example 6, and the groove row 94 formed from a row in which the first groove portions 92 are lined up in the X direction is provided on the outer edge portion 90a of the region between each sensor element. Additionally, the physical quantity sensor 104 is provided with the third groove portion 91 (91e) on the outer edge portion 90a of the first functional element (first sensor element 99) and the second functional element (third sensor element 99b). In the description of Modification Example 9, the same configurations as Modification Example 6 are given the same reference numerals, and description thereof will not be repeated.

The third groove portions 91 extend to both sides via the diagonal lines CL1a, CL2a, CL3a, and CL4a in a direction orthogonal to the four diagonal lines CL1a, CL2a, CL3a, and CL4a passing through each of the four corners of the first and third sensor elements 99 and 99b when the physical quantity sensor 104 is seen in plan view. The diagonal lines CL1a, CL2a, CL3a, and CL4a may also be referred to as the center line passing through the center G of each of the first and third sensor elements 99 and 99b. The third groove portions 91 are present in the four corners of the outer edge portion 90a of each of the first and third sensor elements 99 and 99b, and are arranged in a substantially symmetrical shape with respect to the diagonal lines CL1a, CL2a, CL3a, and CL4a. It is possible to make the third groove portions 91 be the third groove portions 91e with a form (the shape of V in this example) in which the two groove portions (third groove portions 91) on the diagonal lines Cl1 and CL4 positioned on the side facing the first and third sensor elements 99 and 99b are contiguous.

The third groove portion 91 (91e) is a slot (groove) that penetrates from the upper surface to the lower surface of the outer edge portion 90a, similarly to the first groove portion 92. The length or width in the extension direction of the third groove portion 91 (91e) may be approximately the same as the first groove portion 92, or may be different.

The third groove portion 91 (91e) has the same effects if provided in a range of ±(plus or minus) approximately 10 degrees with the diagonal lines CL1a, CL2a, CL3a, and CL4a as the center.

The first groove portion 92 and the third groove portion 91 (91e) are arranged so that the shape configured by the first groove portion 92 and the third groove portion 91 (91e) is two-fold rotationally symmetrical when the physical quantity sensor 104 is seen in plan view.

It is possible for the third groove portions 91 (91e) to be provided on the outer edge portion 90a of the second sensor element 99a.

The third groove portion 91 (91e) may form an arc shape such as using a portion that overlaps concentric circles with the center of the sensor element as a reference.

The physical quantity sensor 104 according to Modification Example 9 has the following effects in addition to the effects of the physical quantity sensor 101 of the above-described Modification Example 6.

The physical quantity sensor 104 is provided with the third groove portions 91 (91e) on the outer edge portion 90a in the four corners of the first and third sensor elements 99 and 99b in addition to the first groove portion 92. The thermal distortion and the like is concentrated from the first direction (X-axis direction) and the second direction (Y-axis direction) by the third groove portion 91 (91e), and it is possible to efficiently alleviate and suppress distortion stress in the corner portions (four corner parts) in which a comparatively large distortion stress arises.

Because the corner portions (four corners) of the outer edge portion 90a in which the diagonal lines CL1a, CL2a, CL3a, and CL4a are provided with a large distance from the center of the first sensor element 99, distortion due to the thermal expansion or the like and the distortion (stress) due to differences in the thermal expansion between the substrate 10 and the outer edge portion 90a increase. Distortion (stress) is imparted from both of the first direction (X-axis direction) and the second direction (Y-axis direction) to the corner portions (four corners) of the outer edge portion 90a. In contrast, because the third groove portion 91 (91e) is provided in a direction orthogonal to the diagonal line, it is possible to efficiently alleviate and suppress while dispersing distortion (stress) imparted from the first direction (X-axis direction) and the second direction (Y-axis direction). Thereby, it is possible to obtain a physical quantity sensor 104 with more stable electrical characteristics in which fluctuations in the electrical characteristics due to leakage vibration or leakage force such as a disturbance transferred from the outside to the first sensor element 99 or the third sensor element 99*b* while having a shield effect of blocking or reducing the leaking of signals that the first sensor element 99 or the third sensor element 99*b* detects or noise imparted on the first sensor element 99 or the third sensor element 99*b* from the outside.

If the third groove portions 91 (91*e*) are provided on the outer edge portion 90*a* of the second sensor element 99*a*, the same effects as described above are exhibited. Modification Example 10

Figure 8B:
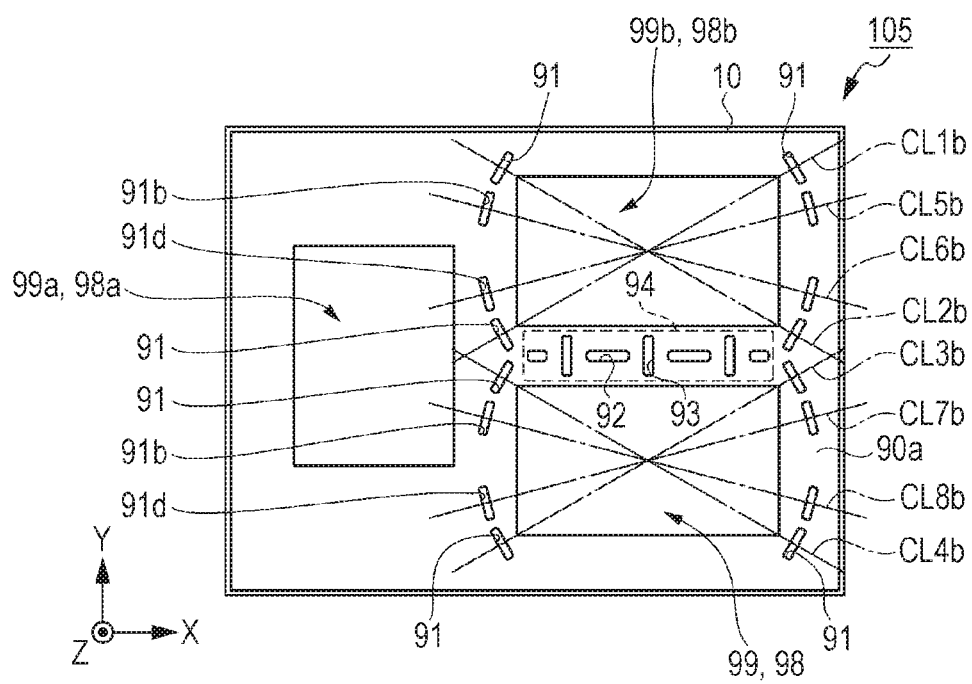

Next, the physical quantity sensor 105 according to Modification Example 10 will be described using FIG. 8B. FIG. 8B is a plan view showing an outline of the physical quantity sensor 105 according to Modification Example 10.

The physical quantity sensor 105 of Modification Example 10 shown in FIG. 8B is provided with a second functional element (second sensor element 99*a* and third sensor element 99*b*), in addition to the first functional element (first sensor element 99) similarly to Modification example 7, and the groove row 94 formed from a row in which the first and second groove portions 92 and 93 are provided alternately lined up in the X-axis direction is provided on the outer edge portion 90*a* of the region between each sensor element. Additionally, the physical quantity sensor 105 is provided with the third groove portions 91 (91*b* and 91*d*) on the outer edge portion 90*a* of the first functional element (first sensor element 99) and the second functional element (third sensor element 99*b*), similarly to Modification Example 9. In the description of Modification Example 9, the same configurations as Modification Examples 7 and 9 are given the same reference numerals, and description thereof will not be repeated.

The third groove portions 91 extend to both sides via the diagonal lines CL1*b*, CL2*b*, CL3*b*, and CL4*b* in a direction orthogonal to the four diagonal lines CL1*b*, CL2*b*, CL3*b*, and CL4*b* passing through each of the four corners of the first and third sensor elements 99 and 99*b* when the physical quantity sensor 105 is seen in plan view. The diagonal lines CL1*b*, CL2*b*, CL3*b*, and CL4*b* may also be referred to as the center line passing through the center G of each of the first and third sensor elements 99 and 99*b*. The third groove portions 91 provided in the eight corners are present in the four corners of the outer edge portion 90*a* of each of the first and third sensor elements 99 and 99*b*, and are arranged in a substantially symmetrical shape with respect to the diagonal lines CL1*b*, CL2*b*, CL3*b*, and CL4*b*. Additionally, in the physical quantity sensor 105, the third groove portions 91*b* and 91*d* extend to both sides via the center lines CL5*b*, CL6*b*, CL7*b*, and CL8*b* in a direction orthogonal to the two center lines CL5*b* and CL6*b* arranged between the diagonal line CL1*b* and the diagonal line CL2*b* of the first sensor element 99 and the two center lines CL7*b*, and CL8*b* arranged between the diagonal line CL3*b* and diagonal line CL4*b* of the third sensor element 99*b*.

The third groove portion 91 (91*b* and 91*d*) is a slot (groove) that penetrates from the upper surface to the lower surface of the outer edge portion 90*a*, similarly to the first and second groove portions 92 and 93. The length or width in the extension direction of the third groove portions 91 (91*b*, 91*d*) may be approximately the same as the first and second groove portions 92 and 93, or may be different.

The third groove portions 91 (91*b* and 91*d*) have the same effects if provided in a range of ±(plus or minus) approximately 10 degrees with the diagonal lines CL1*b*, CL2*b*, CL3*b*, and CL4*b* or the center lines CL5*b*, CL6*b*, CL7*b*, and CL8*b* as the center.

The first groove portion 92, the second groove portion 93, and the third groove portion 91 (91*b* and 91*d*) are arranged so that the shape configured by the first groove portion 92, the second groove portion 93, and the third groove portion 91 is two-fold rotationally symmetrical when the physical quantity sensor 104 is seen in plan view.

It is possible for the third groove portions 91 (91*b* and 91*d*) to be provided on the outer edge portion 90*a* of the second sensor element 99*a*.

The third groove portions 91 (additional third groove portions 91*b* and 91*d*) may form an arc shape such as using a portion that overlaps concentric circles with the center of the sensor element as a reference.

The physical quantity sensor 105 according to Modification Example 10 has the following effects in addition to the effects of the physical quantity sensor 102 of the above-described Modification Example 7.

The physical quantity sensor 105 is provided with the third groove portions 91 on the outer edge portion 90*a* in the four corners of the first and third sensor elements 99 and 99*b* in addition to the first and second groove portions 92 and 93, and with additional third groove portions 91*b* and 91*d* on the outer edge portion 90*a* on the inside thereof. The thermal distortion and the like is concentrated from the first direction (X-axis direction) and the second direction (Y-axis direction) by the third groove portions 91 (91*b* and 91*d*), and it is possible to efficiently alleviate and suppress distortion stress in the corner portions (four corner parts) in which a comparatively large distortion stress arises. Thereby, it is possible to obtain a physical quantity sensor 105 with more stable electrical characteristics in which fluctuations in the electrical characteristics due to leakage vibration or leakage force such as a disturbance transferred from the outside to the first sensor element 99 or the third sensor element 99*b* while having a shield effect of blocking or reducing the leaking of signals that the first sensor element 99 or the third sensor element 99*b* detects or noise imparted on the first sensor element 99 or the third sensor element 99*b* from the outside.

It is possible for the third groove portions 91 (91*b* and 91*d*) to be provided on the outer edge portion 90*a* of the second sensor element 99*a*.

Modification Example 11

Figure 9A:
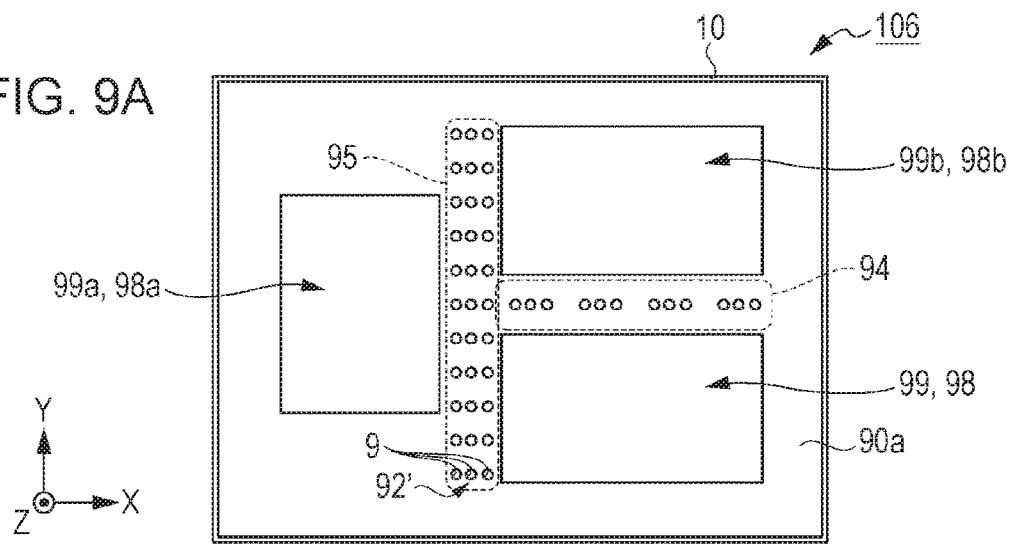
FIGS. 9A to 9C are plan views schematically showing Modification Examples 11 to 13 of the physical quantity sensor according to Embodiment 2 of the electronic device.

Next, the physical quantity sensor 106 according to Modification Example 11 will be described using FIG. 9A. FIG. 9A is a plan view showing an outline of the physical quantity sensor 106 according to Modification Example 11.

The physical quantity sensor 106 of Modification Example 11 shown in FIG. 9A is further provided with a second functional element (second sensor element 99*a* and third sensor element 99*b*), in addition to the first functional element (first sensor element 99) similarly to Modification Example 6, and the groove row 94 formed from a row in which the first groove portions 92 are lined up in the X-axis direction and the groove row 95 formed from a row in which the first groove portions 92 are lined up in the Y-axis direction are provided on the outer edge portion 90*a* of the region between each sensor element.

The difference between Modification Example 11 and Modification Example 6 is that the first groove portion 92 in Modification example 6 is the first groove group 92' in which a plurality of dot-like grooves 9 (in the example, three grooves 9) is arranged lined up in the X-axis direction. Accordingly, in the description of Modification Example 11, although the same configurations as Modification Example 6 are given the same reference numerals and description thereof is not repeated, it is possible to exhibit the same effects as the physical quantity sensor 101 of the above-described Modification Example 6 according to the physical quantity sensor 106. The number of dot-like grooves 9 that configure the first groove group 92' is not relevant.

Modification Example 12

Figure 9B:
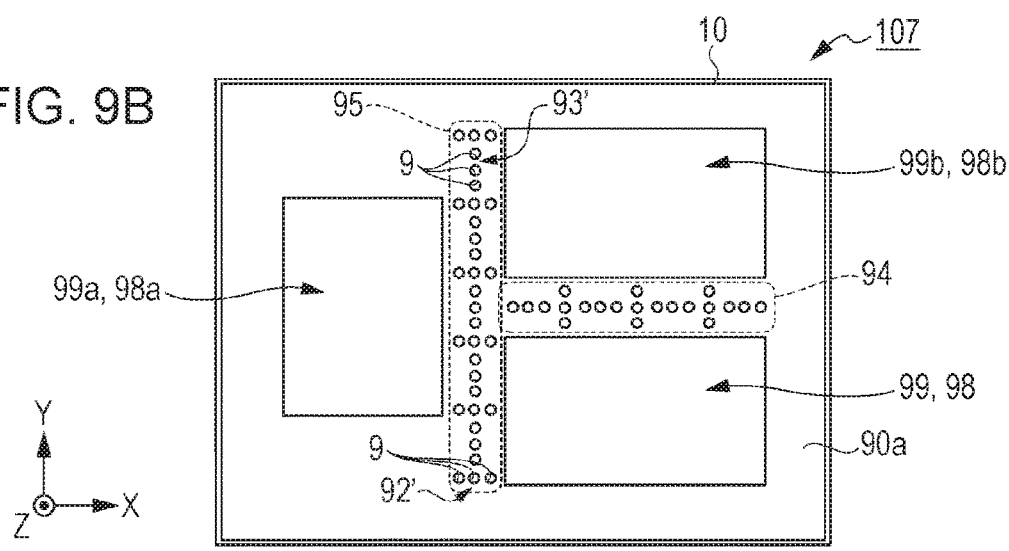

Next, the physical quantity sensor 107 according to Modification Example 12 will be described using FIG. 9B. FIG. 9B is a plan view showing an outline of the physical quantity sensor 107 according to Modification Example 12.

The physical quantity sensor 107 of Modification Example 12 shown in FIG. 9B is further provided with a second functional element (second sensor element 99a and third sensor element 99b), in addition to the first functional element (first sensor element 99) similarly to Modification Example 7, and the first groove group 92' corresponding to the first groove portion 92 of Modification Example 7 and the second groove group 93' corresponding to the second groove portion 93 of Modification Example 7 are provided on the outer edge portion 90a of the region between each sensor element. Specifically, the outer edge portion 90a in the region between the first and third sensor elements 99 and 99b is provided with a groove row 94 formed of a row in which the first and second groove groups 92' and 93' are alternately lined up the X-axis direction, and a groove row 95 formed of a row in which the first and second groove groups 92' and 93' are alternately lined up in the Y-axis direction on the outer edge portion 90a in the region between the first sensor element 99 and the second sensor element 99a, and between the third sensor element 99b and the second sensor element 99a.

The difference between Modification Example 12 and Modification Example 7 is that the first and second groove groups 92' and 93' are configured by a plurality of dot-like grooves 9 (in the example, three grooves 9) is arranged lined up in the X-axis or Y-axis direction. Accordingly, in the description of Modification Example 12, although the same configurations as Modification Example 7 are given the same reference numerals and description thereof is not repeated, it is possible to exhibit the same effects as the physical quantity sensor 102 of the above-described Modification Example 7 according to the physical quantity sensor 107. The number of dot-like grooves 9 that configure the first and second groove groups 92' and 93' is not relevant, and several may be used.

Modification Example 13

Figure 9C:
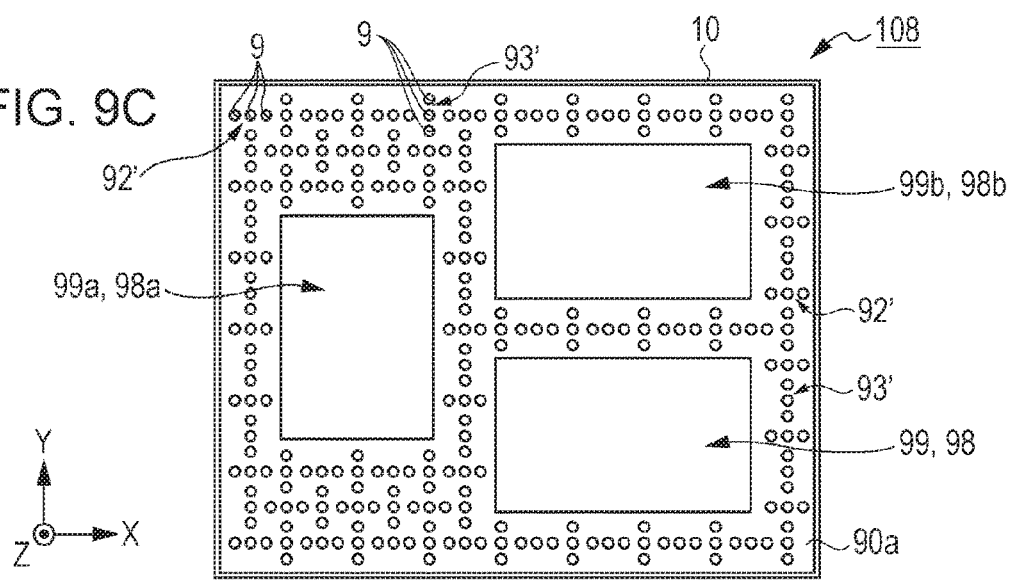

Next, the physical quantity sensor 108 according to Modification Example 13 will be described using FIG. 9C. FIG. 9C is a plan view showing an outline of the physical quantity sensor 108 according to Modification Example 13.

The physical quantity sensor 108 of Modification Example 13 shown in FIG. 9C is further provided with a second functional element (second sensor element 99a and third sensor element 99b), in addition to the first functional element (first sensor element 99) similarly to Modification Example 8, and the first groove group 92' corresponding to the first groove portion 92 of Modification Example 8 and the second groove group 93' corresponding to the second groove portion 93 of Modification Example 8 are provided across all regions (entire surface) of the outer edge portion 90a that surrounds the periphery of each sensor element.

The difference between Modification Example 13 and Modification Example 8 is that the first and second groove portions 92 and 93 of Modification Example 8 are the first and second groove groups 92' and 93' in which a plurality of dot-like grooves 9 (in the example, three grooves 9) is arranged lined up in the X-axis or Y-axis direction. Accordingly, in the description of Modification Example 13, although the same configurations as Modification Example 8 are given the same reference numerals and description thereof is not repeated, it is possible to exhibit the same effects as the physical quantity sensor 103 of the above-described Modification Example 8 according to the physical quantity sensor 108. The number of dot-like grooves 9 that configure the first and second groove groups 92' and 93' is not relevant, and several may be used.

Modification Example 14

Figure 10A:
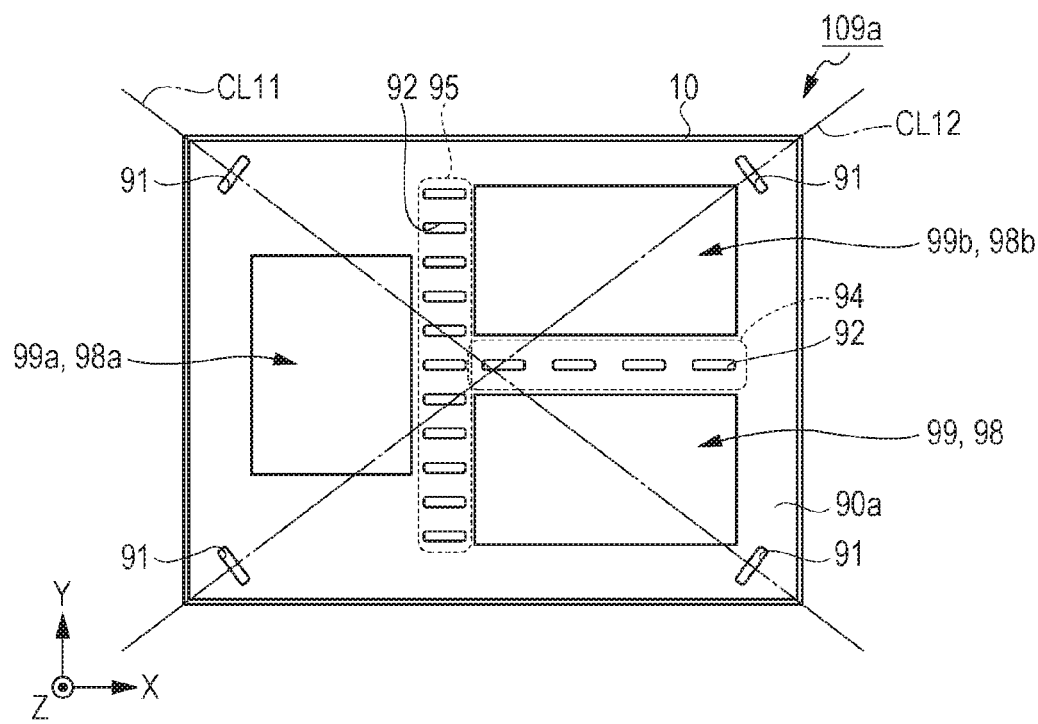
FIGS. 10A and 10B are plan views schematically showing Modification Examples 14 and 15 of the physical quantity sensor according to Embodiment 2 of the electronic device.

Next, the physical quantity sensor 109a according to Modification Example 14 will be described using FIG. 10A. FIG. 10A is a plan view showing an outline of the physical quantity sensor 109a according to Modification Example 14.

The physical quantity sensor 109a of Modification Example 14 shown in FIG. 10A is further provided with a second functional element (second sensor element 99a and third sensor element 99b), in addition to the first functional element (first sensor element 99) similarly to Modification Example 6, and the groove row 94 formed from a row in which the first groove portions 92 are lined up in the X-axis direction is provided on the outer edge portion 90a of the region between each sensor element. Additionally, the physical quantity sensor 109a is provided with the third groove portion 91 on the outer edge portion 90a that surrounds the first functional element (first sensor element 99) and the second functional element (second sensor element 99a and third sensor element 99b) that overlap the outer peripheral portion of the substrate 10. In the description of Modification Example 14, the same configurations as Modification Example 6 are given the same reference numerals, and description thereof will not be repeated.

The third groove portions 91 extend to both sides via the diagonal lines CL11 and CL12 in a direction orthogonal to the four diagonal lines CL11 and CL12 passing through the four corners of the outer edge portion 90a, in a region that surrounds the first, second and third sensor elements 99, 99a, and 99b when the physical quantity sensor 104 is seen in plan view. It is possible for the diagonal lines CL11 and CL12 to be referred to as the center lines passing through the center of the physical quantity sensor 109a. The third groove portions 91 are arranged in a substantially symmetrical shape with respect to the diagonal lines CL11 and CL12. The third groove portion 91 is a slot (groove) that penetrates from the upper surface to the lower surface of the outer edge portion 90a, similarly to the first groove portion 92. The length or width in the extension direction of the third groove portion 91 may be approximately the same as the first groove portion 92, or may be different.

The third groove portion 91 has an equivalent effect if provided in a range of approximately ±(plus or minus) 10 degrees with the above-described diagonal lines CL11 and CL12 as the center.

The first groove portion 92 and the third groove portion 91 are arranged so that the shape configured by the first groove portion 92 and the third groove portion 91 is two-fold rotationally symmetrical when the physical quantity sensor 109a is seen in plan view.

The third groove portion 91 may form an arc shape such as using a portion that overlaps concentric circles with the center of the physical quantity sensor 109a as a reference.

The first and third groove portions 92 and 91 may use a configuration in which the grooves are arranged lined up.

The physical quantity sensor 109a according to Modification Example 14 has the following effects in addition to the effects of the physical quantity sensor 101 of the above-described Modification Example 6.

The physical quantity sensor 109a is provided with third groove portions 91 in the four corners of the outer edge portion 90a that overlaps the outer peripheral portion of the substrate 10. The thermal distortion and the like is concentrated from the first direction (X-axis direction) and the second direction (Y-axis direction) by the third groove portion 91 (91e), and it is possible to efficiently alleviate and suppress distortion stress in the corner portions (four corner parts) in which a comparatively large distortion stress arises.

Because the corner portions (four corners) of the outer edge portion 90a that overlaps the outer peripheral portion of the substrate 10 in which the diagonal lines CL11 and CL12 are provided with a large distance from the center of the physical quantity sensor 109, distortion due to the thermal expansion or the like and the distortion (stress) due to differences in the thermal expansion between the substrate 10 and the outer edge portion 90a increase. Distortion (stress) is imparted from both of the first direction (X-axis direction) and the second direction (Y-axis direction) to the corner portions (four corners) of the outer edge portion 90a. In contrast, because the third groove portion 91 is provided in a direction orthogonal to the diagonal line, it is possible to efficiently alleviate and suppress while dispersing distortion (stress) imparted from the first direction (X-axis direction) and second direction (Y-axis direction).

Thereby, a shield effect is exhibited of blocking or reducing leakage of signals that the first, second and third sensor elements 99, 99a, and 99b detects or noise imparted on the first, second and third sensor elements 99, 99a, and 99b from the substrate 10 side. In so doing, it is possible to obtain a physical quantity sensor 109a with more stable electrical characteristics in which fluctuations in the electrical characteristics due to leakage vibration or leakage force such as a disturbance transferred from the outside to the first, second and third sensor elements 99, 99a, and 99b are suppressed.

Modification Example 15

Figure 10B:
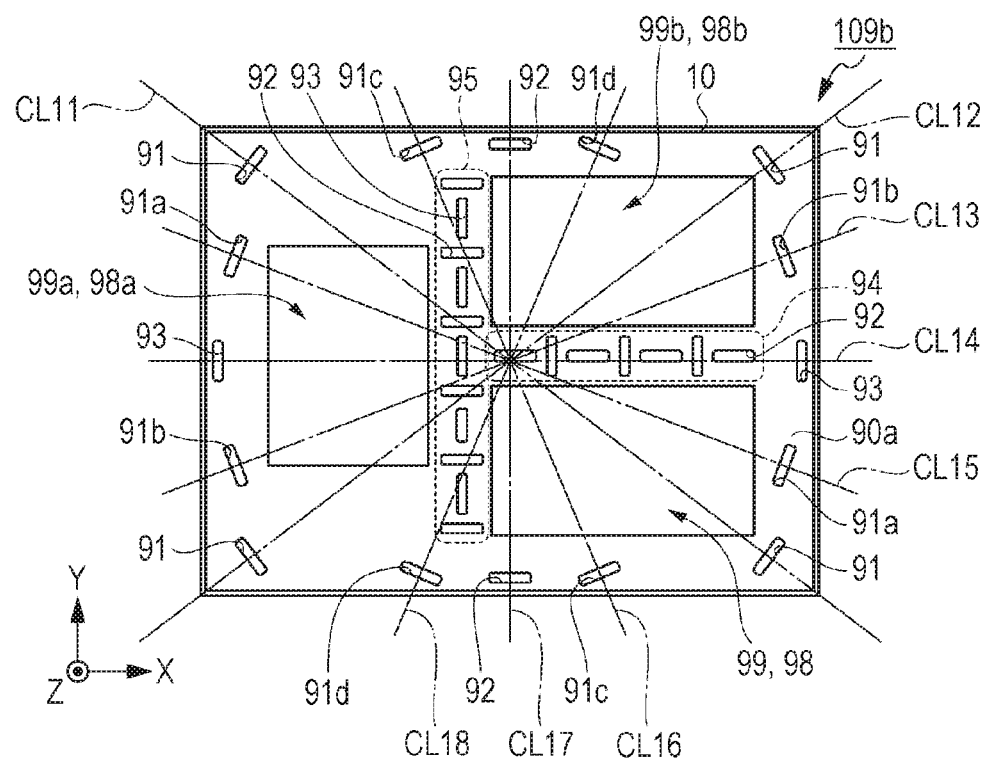

Next, the physical quantity sensor 109b according to Modification Example 15 will be described using FIG. 10B. FIG. 10B is a plan view showing an outline of the physical quantity sensor 109b according to Modification Example 15.

The physical quantity sensor 109b of Modification Example 15 is provided with a second functional element (second sensor element 99a and third sensor element 99b), in addition to the first functional element (first sensor element 99) similarly to Modification Example 7, and the first and second groove portions 92 and 93 are provided on the outer edge portion 90a between each sensor element. Additionally, the physical quantity sensor 109b is provided with the third groove portions 91 in the four corners of the outer edge portion 90a that overlaps the outer peripheral portion of the substrate 10 and provided with the first, second and third groove portions 92, 93 and 91a, 91b, 91c, and 91d in the region of the outer edge portion 90a on the outer peripheral side portion. In this way, the physical quantity sensor 109b is provided with each groove portion so as to surround the first, second and third sensor elements 99, 99a, and 99b on the outer edge portion 90a that overlaps the outer peripheral portion of the substrate 10. In the description of Modification Example 15, the same configurations as Modification Example 7, such as the first and second groove portions 92 and 93 provided on the outer edge portion 90a of the region between the first and third sensor elements 99 and 99b are given the same reference numerals and description thereof will not be repeated.

The third groove portions 91 provided in the four corners of the outer edge portion 90a that overlaps the outer peripheral portion of the substrate 10 extend to both sides via the diagonal lines CL11 and CL12 in a direction orthogonal to the four diagonal lines CL11 and CL12 passing through the four corners of the physical quantity sensor 109b, in a region that surrounds the first, second and third sensor elements 99, 99a, and 99b when the physical quantity sensor 104 is seen in plan view. For the other third groove portions 91a, 91b, 91c, and 91d provided on the outer edge portion 90a that overlaps the outer peripheral portion of the substrate 10, the other third groove portions 91a, 91b, 91c, and 91D are provided a pair at a time extending to both sides via the center lines CL13, CL15, CL16, and CL18 in a direction orthogonal to the center lines CL13, CL15, CL16, and CL18 arranged between the diagonal lines CL11 and CL12. The first groove portion 92 or the second groove portion 93 is provided on the outer edge portion 90a that overlaps the outer peripheral portion of the substrate 10 on the center lines CL14 and CL17 that equally divide the diagonal lines CL11 and CL12.

The third groove portion 91, and the other third groove portions 91a, 91b, 91c, and 91d are slots (grooves) that penetrate from the upper surface to the lower surface of the outer edge portion 90a, similarly to the first and second groove portions 92 and 93. The length or width in the extension direction of the third groove portion 91 and the other third groove portions 91a, 91b, 91c, and 91d may be approximately the same as the first groove portion 92 or the second groove portion 93, or may be different.

The third groove portion 91 and other third groove portions 91a, 91b, 91c, and 91d have an equivalent effect if provided in a range of approximately ±(plus or minus) 10 degrees with the diagonal lines CL11 and CL12 or center lines CL13, CL15, CL16, and CL18 as the center.

The first groove portion 92, the second groove portion 93, and the third groove portion 91 (other third groove portions 91a, 91b, 91c and 91d) are arranged such that the figure formed by the groove portions is two-fold rotationally symmetrical when the physical quantity sensor 109b is seen in plan view.

The first groove portion 92, the second groove portion 93, and the third groove portion 91 (other third groove portions 91a, 91b, 91c and 91d) provided on the outer edge portion 90a that overlaps the substrate 10 may have an arc-shape, such as using a portion that overlaps the concentric circles with the center of the physical quantity sensor 109b as a standard.

The first groove portion 92, the second groove portion 93, and the third groove portion 91 (other third groove portions 91a, 91b, 91c and 91d) may have a configuration in which the grooves as in Modification Example 10 are arranged lined up.

The physical quantity sensor 109b according to Modification Example 15 has the following effects in addition to the effects of the physical quantity sensor 102 of the above-described Modification Example 7.

The physical quantity sensor 109b is provided with the third groove portions 91 in the four corners of the outer edge portion 90a that overlaps the outer peripheral portion of the substrate 10 and provided with the first, second and third groove portions 92, 93 and 91a, 91b, 91c, and 91d in the region of the outer edge portion 90a on the outer peripheral side portion. By providing each groove portion so as to surround the first, second and third sensor elements 99, 99a, and 99b on the outer edge portion 90a that overlaps the outer peripheral portion of the substrate 10, the stress received from the first direction (X-axis direction) and the second direction (Y-axis direction), for example, thermal distortion and the like between the substrate 10 and the outer edge portion 90a of each of the sensor elements is concentrated, and it is possible to efficiently alleviate and suppress distortion stress of the outer edge portion 90a of the corner portions (four corner parts) of the substrate 10, that is, the first sensor element 99, the second sensor element 99a, and the third sensor element 99b, in which a comparatively large distortion stress arises. Thereby, a shield effect is exhibited of blocking or reducing leakage of signals that the first, second and third sensor elements 99, 99a, and 99b detects or noise imparted on the first, second and third sensor elements 99, 99a, and 99b from the substrate 10 side. In so doing, it is possible to obtain a physical quantity sensor 109b with more stable electrical characteristics in which fluctuations in the electrical characteristics due to leakage vibration or leakage force such as a disturbance transferred from the outside to the first, second and third sensor elements 99, 99a, and 99b are suppressed.

In the above-described Modification Examples 6 to 15, although a configuration provided with the first functional element (first sensor element 99) described in Embodiment 2, and the second functional element (second sensor element 99a, third sensor element 99b) in addition to thereto is described as the configuration of the sensor unit, there is no limitation thereto. The configuration of the sensor unit may be provided with the first sensor element (first functional element 98) described in Embodiment 1 and the second functional element (second sensor element 98a and third sensor element 98b in addition to thereto, instead of the functional element in Embodiment 2. Specifically, the first sensor element 99 is substituted with the first sensor element 98, the second sensor element 99a with the second sensor element 98a, and the third sensor element 99b with the third sensor element 98b.

In Embodiments 1 and 2, although the second groove portion 93 was described as arranged at substantially equal intervals between the first groove portions 92 arranged at substantially equal intervals or so as to be alternately lined up neighboring thereto, it is not necessary for the first and second groove portions 92 and 93 to be alternately lined up. It is not necessary to be arranged as equal intervals. Through the effect of stress alleviation assuming the planar shape or size of the outer edge portion on which the first groove portions 92 or second groove portions 93 are arranged or the arrangement or the orientation of the sensor elements, it is desirable to set an appropriate layout.

The sensor element is not necessarily limited to a sensor with the above-described sensor. As long as the configuration as a physical quantity sensor is a configuration of a case of a structure in which the layers that configure the sensor element and the outer edge portion on the main surface of the substrate are layered and the thermal stress generated by differences in the coefficient of thermal expansion between the outer edge portion and the substrate or the stress transmitted via the outer edge portion arranged between the sensor elements influences the detection characteristics of the sensor element, the same effects are obtained.

Embodiment 3

Figure 11:
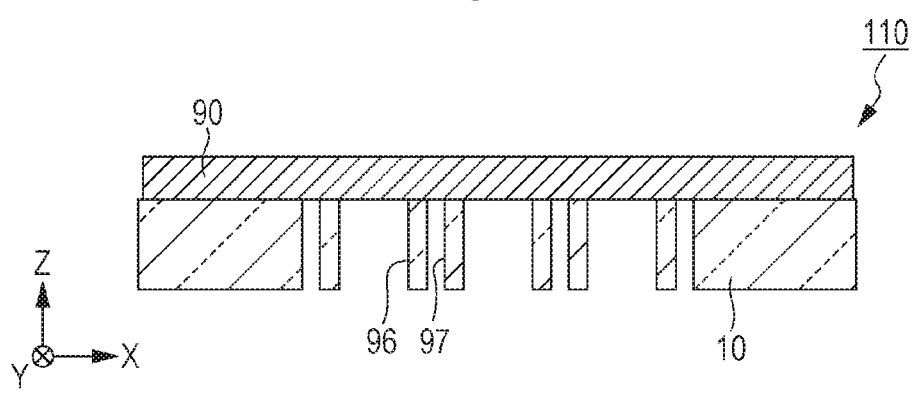
FIG. 11 is a cross-sectional view showing a physical quantity sensor according to Embodiment 3 of an electronic device.

FIG. 11 is a cross-sectional view showing the physical quantity sensor 110 according to Embodiment 3; and is a cross-sectional view at a position corresponding to the cross-section taken along XI-XI in FIG. 4A. In Embodiment 2, although description of providing the first groove portion 92, the second groove portion 93, or the third groove portion 91 for alleviating the stress on the outer edge portion on the main surface of the substrate 10 was made, the groove portions may be provided on the substrate 10. In Embodiment 3, description of a configuration in which the third groove portions 91 are not provided will be made.

The physical quantity sensor 110 may not be provided with the first and second groove portions 92 and 93 on the outer edge portion 90. Instead of these, a third groove 96 and a fourth groove 97 are provided on the substrate 10. Other than these features, the physical quantity sensor 110 is the same as the physical quantity sensor 100 of Embodiment 2. The third groove 96 corresponds to the first groove portion, and the fourth groove 97 corresponds to the second groove portion.

The third groove 96 is a slot that penetrates from the main surface to the lower surface of the substrate 10, and is arranged at the same position as the first groove portion 92 in the physical quantity sensor 100 when the substrate 10 is seen in plan view. The fourth groove 97, similarly, is a slot that penetrates from the main surface to the lower surface of the substrate 10, and is arranged at the same position as the second groove portion 93 in the physical quantity sensor 100 when the substrate 10 is seen in plan view. That is, either of the third groove 96 and the fourth groove 97 is provided at a region that overlaps the outer edge portion 90.

According to the physical quantity sensor 110 according to the embodiment, the substrate 10 includes the third groove 96 that extends in the first direction and the fourth groove 97 that extends in a second direction that intersects the first direction on the region that overlaps the outer edge portion 90. Therefore, the thermal stress generated in a case where the outer edge portion 90 has a different coefficient of thermal expansion to the coefficient of thermal expansion of the substrate 10 is at least alleviated by any of the grooves. As a result, thermal stress generated due to differences in the coefficient of thermal expansion causing the first sensor element 99 to be deformed or exerting an influence on the displacement of the movable portion (movable electrode 50) that the first sensor element 99 is provided is suppressed, and fluctuations in the detection characteristics due to temperature changes in the environment in which the first sensor element 99 is used are suppressed.

That is, even in a case where the grooves for alleviating stress are provided on the substrate 10 as in the embodiment, it is possible to provide the physical quantity sensor 110 with more stable detection characteristics in which fluctuations in the detection characteristics due to temperature changes in the environment in which the sensor is used are suppressed.

By providing the third grooves 96 and the fourth groove 97 on the substrate 10 as in the aspect, since it is not necessary to provide the first, second and third groove portions 92, 93 and 91 on the outer edge portion 90, or it is possible to reduce the area that the groove portions occupy in the outer edge portion 90, or the like, it is possible to obtain a greater effect as a shield electrode due to the outer edge portion 90.

Here, the invention is not limited to the above-mentioned embodiments and modification examples, and various modifications, improvements, and the like can be added to the above-mentioned embodiments. Below, other modification examples will be described. The same reference numerals will be used for the same constituent parts as the above-mentioned embodiments, and overlapping description thereof will not be repeated.

Other Modification Examples

Figure 12A:
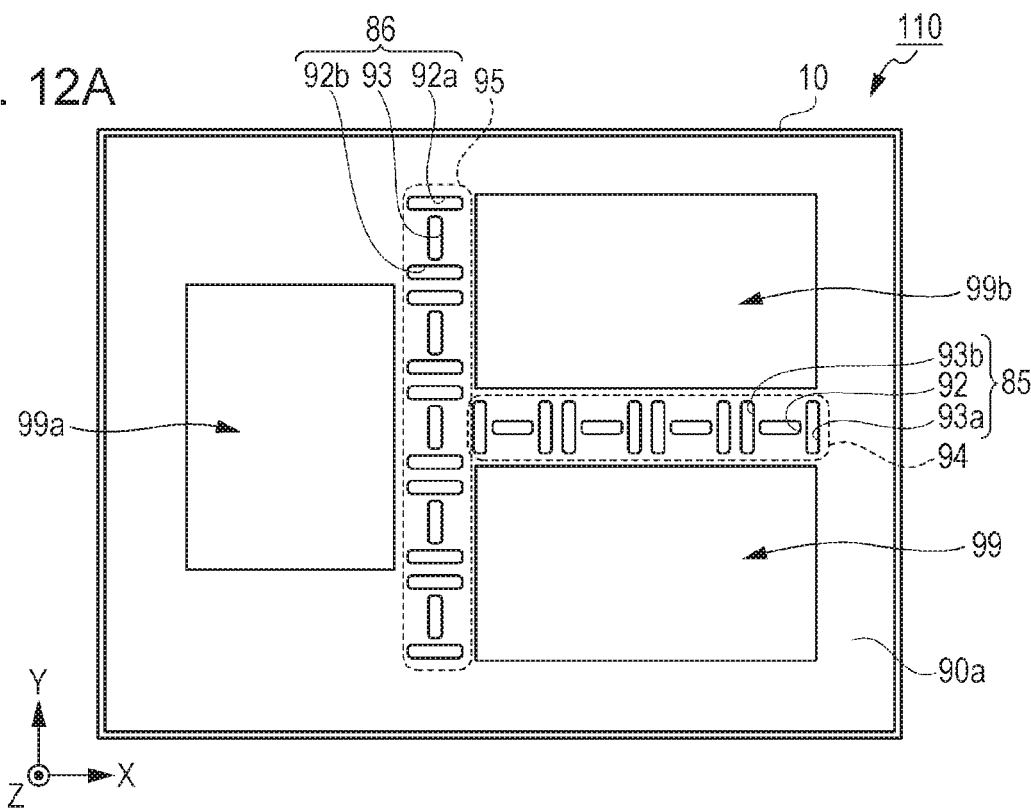
FIG. 12A is a plan view showing Modification Example 16 of the first, second, and third groove portions of the outer edge portion.
Figure 12B:
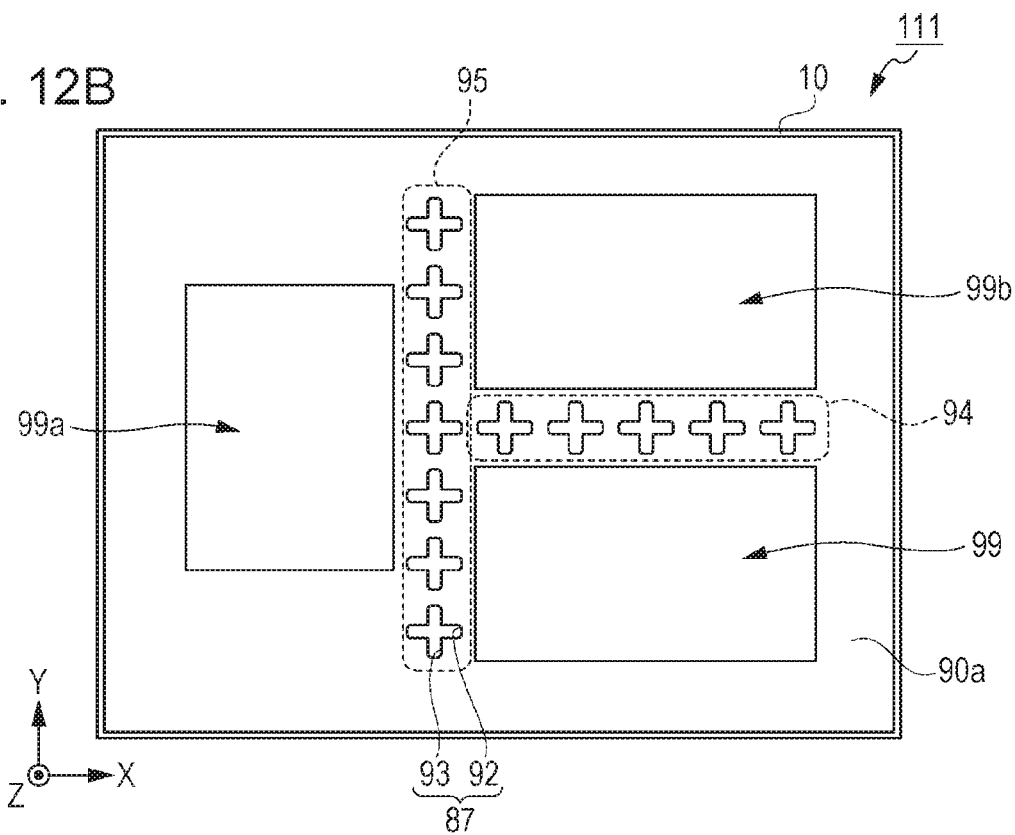
FIG. 12B is a plan view showing a Modification Example 17 of the first, second, and third groove portions of the outer edge portion.

Next, another modification example according to the arrangement of the first groove portion and the second groove portion will be described. In the description, the same reference numerals will be used for the same constituent locations as the above-described embodiment, and overlapping description thereof will not be repeated. FIG. 12A is a plan view showing Modification Example 16 of the first and second groove portions, and FIG. 12B is a plan view showing Modification Example 17 of the first and second groove portions. Modification Examples 16 and 17 differ from the configuration of the above-described Embodiment 2 in the arrangement of the first and second groove portions 92 and 93.

Modification Example 16

The physical quantity sensor 110 of Modification Example 16 shown in FIG. 12A is provided with a groove row 94 in which the first groove portions 92 and the second groove portions 93 are lined up in the X-axis direction on the outer edge portion 90a on the region between the first sensor element 99 and the third sensor element 99b, similarly to Embodiment 2. A groove row 95 formed from a row in which the first and second groove portions 92 and 93 are alternately lined up in the Y-axis direction is provided on the outer edge portion 90a in the region between the first and second sensor elements 99 and 99a and between the third and second sensor elements 99b and 99a. The arrangement of the first and second groove portions 92 and 93 in the groove row 94 includes groove groups 85, in which the second groove portion 93a and the second groove portion 93b are arranged with the first groove portion 92 interposed, lined up in the X-axis direction. The arrangement of the first and second groove portions 92 and 93 in the groove row 95 includes groove groups 86, in which the first groove portion 92a and the first groove portion 92b are arranged with the second groove portion 93 interposed, lined up in the Y-axis direction.

Modification Example 17

The physical quantity sensor 111 of Modification Example 17 shown in FIG. 12B is provided with a groove row 94 formed from a row in which the first groove portions 92 and the second groove portions 93 are lined up in the X-axis direction on the outer edge portion 90a on the region between the first sensor element 99 and the third sensor element 99b, similarly to Embodiment 2. A groove row 95 formed from a row in which the first and second groove portions 92 and 93 are alternately lined up in the Y-axis direction is provided on the outer edge portion 90a in the region between the first and second sensor elements 99 and 99a and between the third and second sensor elements 99b and 99a. In the groove row 94 and the groove row 95, the groove groups 87 with a shape in which the first and second groove portions 92 and 93 intersect in the substantial center, a so-called cross shape, are arranged. The groove groups 87 that form the cross shape of the groove rows 94 and 95 of Modification Example 17 are lined up in the X-axis direction and the Y-axis direction.

Even in the first and second groove portions 92 and 93 of the arrangement as in the above-described Modification Examples 16 and 17, the thermal stress generated in a case where the outer edge portion 90a has a different coefficient of thermal expansion to the coefficient of thermal expansion of the substrate 10 is alleviated by at least either of the first and second groove portions 92 and 93. It is possible to easily form the first sensor element (first functional element) 99, the outer edge portion 90, and the first and second groove portions 92 and 93 of the outer edge portion 90 with the same step. A physical quantity sensor with more stable detection characteristics in which fluctuations in the detection characteristics due to temperature changes in the environment in which the sensor is used are suppressed can be easily formed and provided.

In the above-described Modification Examples 16 and 17, although a configuration provided with the first functional element (first sensor element 99) described in Embodiment 2, and the second functional element (second sensor element 99a, third sensor element 99b) in addition to thereto is described as the configuration of the sensor unit, there is no limitation thereto. The configuration of the sensor unit may be provided with the first sensor element (first functional element 98) described in Embodiment 1 and the second functional element (second sensor element 98a and third sensor element 98b) in addition to thereto, instead of the functional element in Embodiment 2. Specifically, the first sensor element 99 is substituted with the first sensor element 98, the second sensor element 99a with the second sensor element 98a, and the third sensor element 99b with the third sensor element 98b.

The first and second groove portions 92 and 93 described in the above-described Modification Examples 16 and 17 may use a configuration in which the grooves 9 are arranged lined up as in Modification Example 11.

In the above-described Embodiments 1-3, although a configuration in which the groove rows 94 and 95 are both provided, it is not necessary to provide both of the groove rows 94 and 95, and the groove rows may be provided in the region necessary for alleviation of the stress generated between the sensor elements.

The outer edge portion 90 may not surround the entire periphery of the sensor element 99. That is, as long as at least a portion of effects of the invention is exhibited, a portion of the outer edge portion 90 may be opened.

Although the first direction is described in the above-described Embodiments 1 to 3 as the X-axis direction that is the displacement direction of the movable portion (movable electrode 50), there is no limitation thereto. For example, the Y-axis direction can be the first direction and the X-axis direction can be the second direction.

In Embodiments 1 to 3, although the first, second and third groove portions 92, 93, and 91 are described as slots that penetrate from the upper surface to the lower surface of the outer edge portions 90 and 90a, the slots may not necessarily penetrate. That is, the first, second and third groove portions 92, 93, and 91 may be grooves having a bottom portion not penetrating both or one of the outer edge portion 90 and 90a. The bottom portion maybe be on the bottom surface side (substrate 10 side) or, conversely, may be on the upper surface side.

Electronic Apparatus

Next, an electronic apparatus to which the physical quantity sensor 100 as an electronic device according to an embodiment of the invention is applied will be described based on FIGS. 13A and 13B and FIG. 14. In the following description, although an example in which the physical quantity sensor 100 is applied is described, the physical quantity sensors 1, 101 to 108, 109a, 109b, 110 and 111 may also be used.

Figure 13A:
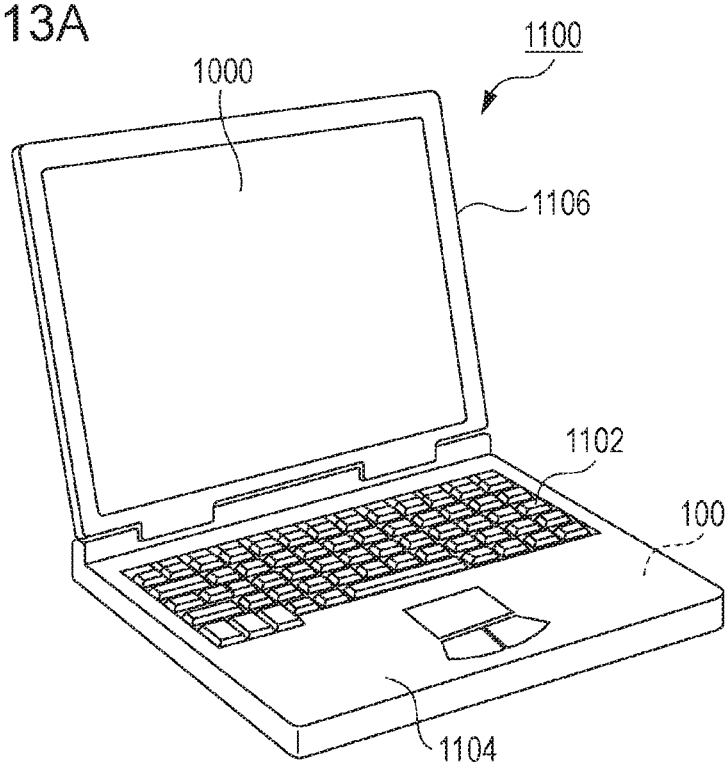
FIG. 13A is a perspective view showing a configuration of a mobile-type personal computer as an example of the electronic apparatus.

FIG. 13A is a perspective view showing a schematic configuration of a mobile-type (or notebook-type) personal computer as the electronic apparatus provided with the electronic device according to an embodiment of the invention. In the drawing, a personal computer 1100 is configured by a main body portion 1104 provided with a keyboard 1102, and a display unit 1106 provided with a display portion 1000, and the display unit 1106 is supported to be able to rotate via a hinge structure unit with respect to the main body portion 1104. The physical quantity sensor 100 as an example of the electronic device that functions as a filter, a resonator, a reference clock, and the like is built into such a personal computer 1100.

Figure 13B:
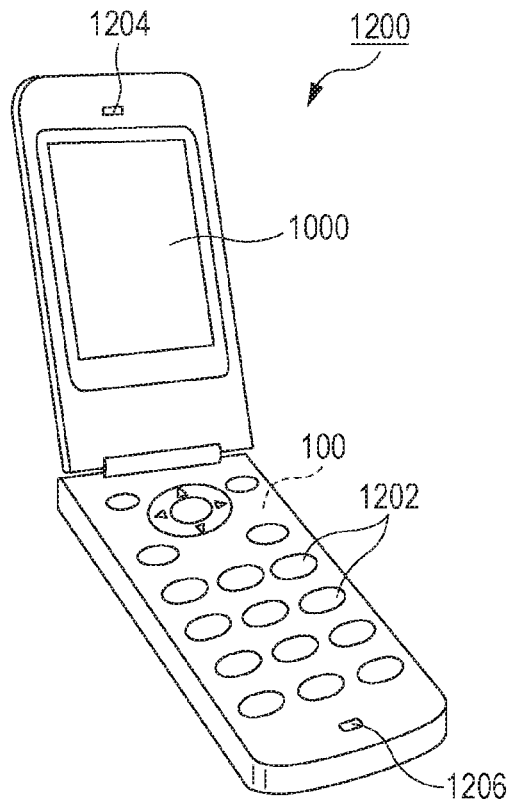
FIG. 13B is a perspective view showing a configuration of a mobile telephone as an example of the electronic apparatus.

FIG. 13B is a perspective view showing an outline of a configuration of a mobile telephone (including a PHS) as the electronic apparatus provided with the electronic device according to an embodiment of the invention. In the drawing, the mobile telephone 1200 is provided with a plurality of operation buttons 1202, an earpiece 1204, and a mouthpiece 1206, and a display portion 1000 is arranged between the operation buttons 1202 and the earpiece 1204. The physical quantity sensor 100 as an example of the electronic device that functions as a filter, a resonator, an angular velocity sensor, and the like is built into such a mobile telephone 1200.

Figure 14:
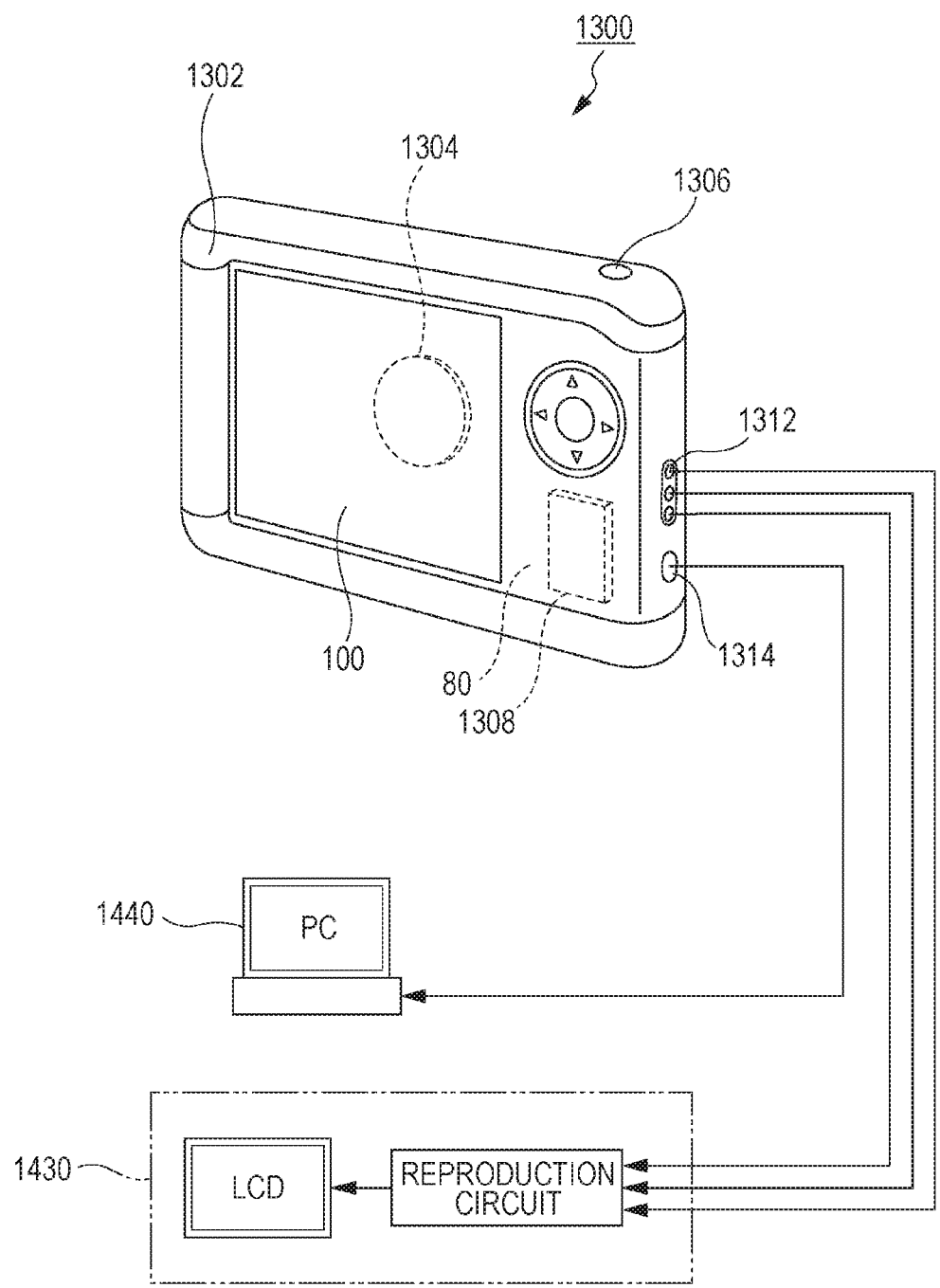
FIG. 14 is a perspective view showing a configuration of a digital still camera as an example of the electronic apparatus.

FIG. 14 is a perspective view showing an outline of a configuration of a digital still camera as the electronic apparatus provided with the electronic device according to an embodiment of the invention. In the drawings, the connection with the external apparatus is shown simplified. The digital still camera 1300 images a subject and generates an imaging signal (image signals) by photoelectric conversion with an imaging element such as a coupled charge device (CCD).

A display portion 1000 is provided on the rear surface of the case (body) 1302 of the digital still camera 1300, is configured to perform display based on the imaging signal by the CCD, and the display portion 1000 functions as a viewfinder that displays a subject as an electronic image. A light receiving unit 1304 that includes an optical lens (imaging optical system), CCD or the like is provided on the front surface side (in the configuration in the drawing, rear surface side) of the case 1302.

The photographer verifies the subject image displayed on the display portion 1000, and when the shutter button 1306 is depressed, the imaging signal of the CCD at this point in time is transferred to and stored in the memory 1308. In the digital still camera 1300, a video signal output terminal 1312 and an input-output terminal 1314 for data communication are provided on the side surface of the case 1302. As shown in the drawings, a television monitor 1430 and a personal computer 1440 are connected, as necessary, to the video signal output terminal 1312 and to the input-output terminal 1314 for data communication, respectively. The imaging signal stored in the memory 1308 is output to the television monitor 1430 or the personal computer 1440 with a predetermined operation. The physical quantity sensor 100 as an example of the electronic device that functions as a filter, a resonator, an angular velocity sensor, and the like is built into such a digital still camera 1300.

It is possible to provide an electronic apparatus with higher operation precision by providing the physical quantity sensor 100, in which lowering of the detection precision is further suppressed, as the electronic apparatus.

It is possible to apply the physical quantity sensor 100 according to an embodiment of the invention to electronic apparatuses, such as ink jet type discharge devices (ink jet printers), laptop personal computers, televisions, video cameras, car navigation systems, pagers, electronic organizers (including those with communication function), electronic dictionaries, calculators, electronic game machines, workstations, videophones, television monitors for security, electronic binoculars, POS terminals, medical equipment (for example, electronic thermometers, blood pressure monitors, blood glucose meters, ECG display devices, ultrasonic diagnostic devices, and endoscopic display devices), fishfinders, various measurement apparatuses, meters, (for example, instruments for vehicles, aircraft, and ships), and flight simulators, in addition to the personal computer (mobile personal computer) in FIG. 13A, the mobile telephone in FIG. 13B and the digital still camera in FIG. 14.

Moving Object

Next, a moving object to which the physical quantity sensor 100 according to an embodiment of the invention is applied will be described based on FIG. 15. In the following description, although an example in which the physical quantity sensor 100 is applied is described, the physical quantity sensors 1, 101 to 108, 109a, 109b, 110 and 111 may also be used.

Figure 15:
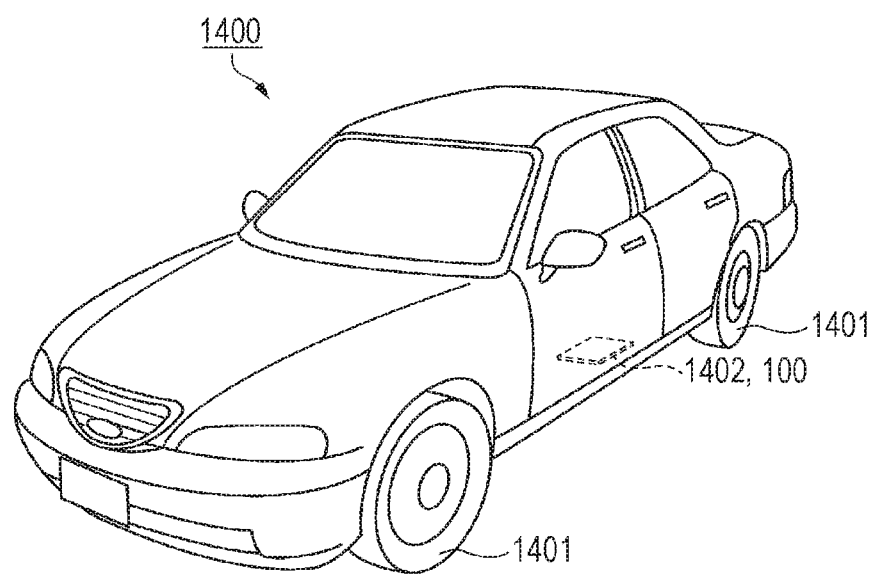
FIG. 15 is a perspective view schematically showing an automobile as an example of a moving object.

FIG. 15 is a perspective view schematically showing an automobile 1400 as a moving object provided with the physical quantity sensor 100. A gyro sensor configured including the physical quantity sensor 100 according to the invention is mounted to the automobile 1400. As shown in FIG. 15, an electronic control unit 1402 with a gyro sensor that controls the tires 1401 built-in is mounted to the automobile 1400 as the moving object. As other example, it is possible for the physical quantity sensor 100 to be widely applied to an electronic control units (ECU) such as keyless entry, an immobilizer, a car navigation system, car air conditioning, an anti-lock braking system (ABS), an air bag, a tire pressure monitoring system (TPMS), an engine controller, a battery monitor for a hybrid automobile or an electric automobile, and a vehicle attitude control system.

As described above, it is possible to provide a moving object with more stable environmental characteristics, such as temperature changes, by providing the physical quantity sensor 100, in which lowering of the precision is further suppressed, as the moving object.

The entire disclosure of Japanese Patent Application No. 2015-000681, filed Jan. 6, 2015 is expressly incorporated by reference herein.

What is claimed is:

1. An electronic device, comprising:
   a first sensor detecting a physical quantity in a first direction, the first sensor detecting acceleration based on variation of capacitance;
   a second sensor detecting a physical quantity in a second direction different from the first direction, the second direction being orthogonal to the first direction; and
   an outer edge portion arranged on at least a portion of an outer periphery of the first sensor, wherein a plurality of first elongated grooves are arranged extending in a first elongated direction or lined up along the first elongated direction and are provided on the outer edge portion when the outer edge portion is seen in plan view, the plurality of first elongated grooves being configured to reduce transmission of leakage vibration or leakage force transferred from the outer edge portion to the first sensor, the plurality of first elongated grooves are through-holes extending through a thickness of the outer periphery and have a closed shape defined by the outer edge portion, at least a portion of the plurality of first elongated grooves are sandwiched between the first sensor and the second sensor, a plurality of second elongated grooves are arranged extending in a second elongated direction intersecting the first elongated direction or lined up along the second elongated direction and are provided on the outer edge portion when the outer edge portion is seen in plan view, and the plurality of first elongated grooves alternate with the plurality of the second elongated grooves on at least one side of the outer edge portion such that one of the plurality of second elongated grooves is sandwiched by two of the plurality of first elongated grooves.

2. The electronic device according to claim 1,
wherein the plurality of first elongated grooves and the plurality of second elongated grooves are arranged on at least one side in the outer periphery of the first sensor.

3. The electronic device according to claim 1, further comprising:
a plurality of third elongated grooves arranged extending or lined up in a direction orthogonal to a central line passing through a center of the first sensor and provided on the outer edge portion when the outer edge portion is seen in plan view.

4. The electronic device according to claim 3,
wherein the outer edge portion is rectangular, and
the third groove portion includes the third grooves arranged extending or lined up in a direction orthogonal to the center line that is a diagonal line of the outer edge portion.

5. The electronic device according to claim 3,
wherein the shape configured by the plurality of first elongated grooves, the plurality of second elongated grooves, and the plurality of third elongated grooves is arranged to be rotationally symmetrical when the first sensor is seen in plan view.

6. The electronic device according to claim 3,
wherein at least one of the plurality of first elongated grooves, the plurality of second elongated grooves, and the plurality of third elongated grooves penetrates the outer edge portion or a substrate in a thickness direction of the first sensor.

7. The electronic device according to claim 1,
wherein the first sensor includes
a fixed portion,
a support unit that extends from the fixed portion, and
a movable portion supported to be displaceable by the support unit.

8. The electronic device according to claim 7,
wherein the first direction is the direction in which the movable portion is displaced in plan view of the first sensor.

9. The electronic device according to claim 1,
wherein the first sensor and the outer edge portion are the same material.

10. The electronic device according to claim 1,
wherein the outer edge portion is a fixed potential that is a ground potential or a constant potential.

11. An electronic apparatus comprising:
the electronic device according to claim 1.

12. A moving object comprising:
the electronic device according to claim 1.

13. The electronic device according to claim 1, wherein
the first groove includes a length in a first axis direction and a width in a second axis direction, with the length being longer than the width, and the length is a maximum of 70% of a first width of the outer periphery in the first axis direction, and the width is a maximum of 10% of a second width of the outer periphery in the second axis direction.

14. The electronic device according to claim 1, wherein
the first groove is of a closed-rectangular shape and includes a length in a first axis direction and a width in a second axis direction, the length being longer than the width, and the first axis direction is parallel to a detection axis of the first sensor.

15. An electronic device, comprising:
a first sensor detecting a physical quantity in a first direction, the first sensor detecting acceleration based on variation of capacitance;

a second sensor detecting a physical quantity in a second direction different from the first direction, the second direction being orthogonal to the first direction;

an outer edge portion arranged on at least a portion of an outer periphery of the first sensor; and a substrate, wherein the first sensor is provided on a main surface of the substrate, at least two of a first groove portion in which first elongated grooves are arranged extending or lined up in a first elongated direction, a second groove portion in which second elongated grooves are arranged extending or lined up in a second elongated direction that intersects the first elongated direction, and a third groove portion in which third elongated grooves are arranged extending or lined up in a direction orthogonal to a center line passing through the center of the first sensor are provided on at least one of the outer edge portion and a region overlapping the outer edge portion when seen in plan view, the at least two of the first elongated grooves, second elongated grooves, and third elongated grooves being configured to reduce transmission of leakage vibration or leakage force transferred from the outer edge portion to the first sensor, the at least two of the first elongated grooves, the second elongated grooves, and the third elongated grooves are through-holes extending through a thickness of the outer edge portion or the region overlapping the outer edge portion when seen in the plan view and have a closed shape defined by the outer edge portion, the at least two of the first elongated grooves, the second elongated grooves, and the third elongated grooves are sandwiched between the first sensor and the second sensor, and the at least two of the first elongated grooves, the second elongated grooves, and the third elongated grooves alternate on at least one side of the outer edge portion such that one of a first of the at least two of the first elongated grooves, the second elongated grooves, and the third elongated grooves is sandwiched by two of a second of the at least two of the first elongated grooves, the second elongated grooves, and the third elongated grooves.

16. The electronic device according to claim 15, wherein the first sensor includes
a fixed portion,
a support unit that extends from the fixed portion, and
a movable portion supported to be displaceable by the support unit.

17. The electronic device according to claim 16, wherein the fixed portion is fixed on the main surface of the substrate, and
the movable portion is supported to be displaceable while isolated from the substrate by the support unit.

18. The electronic device according to claim 15, further comprising:
a second sensor on the main surface of the substrate,
wherein at least one of the first, second and third groove portions is provided between the first and second sensors.

19. A physical quantity sensor, comprising:
a first sensor element detecting a physical quantity in a first direction, the first sensor element detecting acceleration based on variation of capacitance;
a second sensor element detecting a physical quantity in a second direction different from the first direction, the second direction being orthogonal to the first direction; and
an outer edge portion arranged on at least a portion of an outer periphery of the first sensor element,
wherein a first groove portion in which first elongated grooves are arranged extending in a first elongated direction or lined up along the first elongated direction is provided on the outer edge portion when the outer edge portion is seen in plan view, the first elongated grooves being configured to reduce transmission of leakage vibration or leakage force transferred from the outer edge portion to the first sensor element,
the first elongated grooves are through-holes extending through a thickness of the outer edge portion and have a closed shape defined by the outer edge portion,
at least a portion of the first elongated grooves are sandwiched between the first sensor element and the second sensor element,
a second groove portion in which second elongated grooves are arranged extending in a second elongated direction intersecting the first elongated direction or lined up along the second elongated direction is provided on the outer edge portion when the outer edge portion is seen in plan view, and
the first elongated grooves alternate with the second elongated grooves on at least one side of the outer edge portion such that one of the second elongated grooves is sandwiched by two of the first elongated grooves.

20. The physical quantity sensor according to claim 19, wherein the first and second groove portions are arranged lined up on at least one side in the outer periphery of the first sensor element.

21. The physical quantity sensor according to claim 19, further comprising:
a third groove portion in which third grooves are arranged extending or lined up in a direction orthogonal to a central line passing through a center of the first sensor element is provided on the outer edge portion when the outer edge portion is seen in plan view.

22. The physical quantity sensor according to claim 19, wherein the first groove portion is a groove group that includes a plurality of the grooves.

23. A physical quantity sensor, comprising:
a first sensor element detecting a physical quantity in a first direction, the first sensor element detecting acceleration based on variation of capacitance;
a second sensor element detecting a physical quantity in a second direction different from the first direction, the second direction being orthogonal to the first direction;
an outer edge portion arranged on at least a portion of an outer periphery of the first sensor element, and
a substrate,
wherein the first sensor element and the second sensor element are provided on a main surface of the substrate;
at least two of a first groove portion in which first elongated grooves are arranged extending or lined up in a first direction, a second groove portion in which second elongated grooves are arranged extending or lined up in a second direction that intersects the first direction, and a third groove portion in which third elongated grooves are arranged extending or lined up in a direction orthogonal to a center line passing through a center of the first sensor element are provided on at least one of the outer edge portion and a region overlapping the outer edge portion when seen in plan view, the at least two of the first elongated grooves, second elongated grooves, and third elongated grooves being configured to reduce transmission of leakage vibration or leakage force transferred from the outer edge portion to the first sensor,
the at least two of the first elongated grooves, the second elongated grooves, and the third elongated grooves are through-holes extending through a thickness of the outer edge portion or the region overlapping the outer edge portion when seen in the plan view and have a closed shape defined by the outer edge portion,
at least a portion of the at least two of the first elongated grooves, second elongated grooves, and third elongated grooves are sandwiched between the first sensor element and the second sensor element, and
the at least two of the first elongated grooves, the second elongated grooves, and the third elongated grooves alternate on at least one side of the outer edge portion such that one of a first of the at least two of the first elongated grooves, the second elongated grooves, and the third elongated grooves is sandwiched by two of a second of the at least two of the first elongated grooves, the second elongated grooves, and the third elongated grooves.

* * * * *